(12) United States Patent
Tanaka

(10) Patent No.: US 7,271,040 B2
(45) Date of Patent: Sep. 18, 2007

(54) ELECTRODE CONTACT SECTION OF SEMICONDUCTOR DEVICE

(75) Inventor: Masahiro Tanaka, Yokohama (JP)

(73) Assignee: Kabushiki Kaisha Toshiba, Kawasaki-shi (JP)

( * ) Notice: Subject to any disclaimer, the term of this patent is extended or adjusted under 35 U.S.C. 154(b) by 0 days.

(21) Appl. No.: 11/347,321

(22) Filed: Feb. 6, 2006

(65) Prior Publication Data

US 2006/0125005 A1  Jun. 15, 2006

Related U.S. Application Data

(63) Continuation of application No. 09/853,661, filed on May 14, 2001, now abandoned.

(30) Foreign Application Priority Data

May 15, 2000  (JP) ............................. 2000-141914

(51) Int. Cl.
*H01L 21/332* (2006.01)

(52) U.S. Cl. ...................... 438/133; 438/135; 438/197; 257/E21.388

(58) Field of Classification Search ................ 438/133, 438/135, 197; 257/E21.388
See application file for complete search history.

(56) References Cited

U.S. PATENT DOCUMENTS

| | | | |
|---|---|---|---|
| 4,053,924 A | 10/1977 | Roman et al. | |
| 4,893,165 A | 1/1990 | Miller et al. | |
| 4,961,099 A | 10/1990 | Roggwiller | |
| 5,136,349 A | 8/1992 | Yilmaz et al. | |
| 5,166,770 A | 11/1992 | Tang et al. | |
| 5,200,632 A | 4/1993 | Sakurai | |
| 5,270,230 A | 12/1993 | Sakurai | |
| 5,331,184 A | 7/1994 | Kuwahara | |
| 5,360,984 A | 11/1994 | Kirihata | |
| 5,444,271 A * | 8/1995 | Kuwahara | .................... 257/136 |
| 5,668,385 A | 9/1997 | Bauer et al. | |
| 5,808,345 A | 9/1998 | Kinzer | |
| 5,985,708 A | 11/1999 | Nakagawa et al. | |
| 6,259,123 B1 * | 7/2001 | Kelberlau et al. | .......... 257/107 |

(Continued)

FOREIGN PATENT DOCUMENTS

EP    0 365 107    4/1990

(Continued)

*Primary Examiner*—Jerome Jackson
*Assistant Examiner*—José R. Diaz
(74) *Attorney, Agent, or Firm*—Oblon, Spivak, McClelland, Maier & Neustadt, P.C.

(57) ABSTRACT

A p-type impurity layer is formed in an n-type semiconductor substrate. Since the p-type impurity layer has a low impurity concentration and a sufficiently shallow depth of 1.0 μm or less, the carrier injection coefficient can be reduced. In the p-type impurity layer, a p-type contact layer of a high impurity concentration is formed for reducing a contact resistance. Since the p-type contact layer has a sufficiently shallow depth of 0.2 μm or less, it does not influence the carrier injection coefficient. Further, a silicide layer is formed between the p-type contact layer and an electrode such that the contact-layer-side end of the silicide layer corresponds to that portion of the p-type contact layer, at which the concentration profile of the contact layer assumes a peak value. The silicide layer further reduces the contact resistance.

14 Claims, 8 Drawing Sheets

U.S. PATENT DOCUMENTS

| | | |
|---|---|---|
| 6,309,920 B1 | 10/2001 | Laska et al. |
| 6,482,681 B1 | 11/2002 | Francis et al. |
| 2003/0042525 A1 | 3/2003 | Tanaka |
| 2005/0156231 A1 | 7/2005 | Okuno et al. |

FOREIGN PATENT DOCUMENTS

| | | |
|---|---|---|
| EP | 0 621 640 | 10/1994 |
| EP | 0 696 066 | 2/1996 |
| JP | 62-23170 | 1/1987 |
| JP | 64-47066 | 2/1989 |
| JP | 5-152574 | 6/1993 |
| JP | 6-69509 | 3/1994 |
| JP | 06069509 A * | 3/1994 |
| JP | 7-58322 | 3/1995 |
| JP | 10-4187 | 1/1998 |

\* cited by examiner

ELECTRODE CONTACT SECTION OF SEMICONDUCTOR DEVICE

CROSS-REFERENCE TO RELATED APPLICATIONS

This application is a continuation of and claims the benefit of priority under 35 U.S.C. §120 from U.S. application Ser. No. 09/853,661, filed May 14, 2001 now abandoned and is based upon and claims the benefit of priority from prior Japanese Patent Application No. 2000-141914, filed on May 15, 2000 in Japan, the entire contents of which are incorporated herein by reference.

BACKGROUND OF THE INVENTION

The present invention relates to an electrode contact section incorporated in a semiconductor device.

In the prior art, en electrode section incorporated in a semiconductor device is formed of an impurity layer provided in a semiconductor layer, and an electrode (made of, for example, a metal such as aluminum) that is in contact with the impurity layer. The impurity layer is often formed by ion implantation for the purpose of low cost.

In the electrode contact section, it is important to reduce the contact resistance of the electrode and the impurity layer. To reduce the contact resistance, the concentration of an impurity in the impurity layer is generally increased.

However, when forming an impurity layer by ion implantation, the concentration profile of the impurity layer shows a curved line with a peak. The impurity concentration of a surface portion of the semiconductor layer is lower than a peak concentration assumed at an inner portion thereof. In particular, in a longitudinal power device such as an IGBT, there is a case where a MOS structure is provided at one surface of a semiconductor layer, and an impurity layer is provided at the other surface thereof. In this case, the impurity layer at the other surface of the semiconductor layer cannot be annealed at a high temperature for a long time, with the result that the difference between the peak concentration and the surface concentration of the impurity layer is increased, and hence the contact resistance cannot sufficiently be reduced.

Further, in an IGBT (Insulated Gate Bipolar Transistor) as shown in FIG. 1, for example, it is necessary to reduce the contact resistance of an electrode contact section (a contact section between the impurity layer 2 and an anode layer 3), and also to quickly prevent carrier injection from an impurity layer ($p^+$-type emitter layer) 2 to an $n^+$-type base layer 1 when turning off the semiconductor device, in order to turn off the device at high speed.

However, to reduce the contact resistance at the electrode contact section, it is necessary to increase the impurity concentration of the impurity layer 2. On the other hand, to quickly turn off the semiconductor device, it is necessary to reduce the impurity concentration of the impurity layer 2, and also to make the impurity layer 2 shallow so as to reduce the coefficient of carrier injection from the impurity layer 2 to the $n^+$-type base layer 1.

In other words, concerning the impurity concentration of the impurity layer 2 at the electrode contact section, a reduction of the contact resistance and an increase of the speed of the turn-off of the semiconductor device (i.e. a reduction of the carrier injection coefficient) is a tradeoff relationship. Accordingly, these two purposes cannot be satisfied simultaneously.

BRIEF SUMMARY OF THE INVENTION

The present invention has been may provided an electrode contact section of a sufficiently low contact resistance even when forming an impurity layer by ion implantation. The invention has been may provided an electrode contact section in which the contact resistance and the carrier injection coefficient can simultaneously be reduced.

According to an aspect of the invention, there is provided an electrode contact section incorporated in a semiconductor device, comprising: a first-conductivity-type semiconductor substrate; a second-conductivity-type impurity layer formed in one surface of the semiconductor substrate and having a thickness of not more than 1.0 μm from a surface of the semiconductor substrate; a second-conductivity-type contact layer formed in the impurity layer and having a thickness of not more than 0.2 μm from the surface of the semiconductor substrate, the contact layer being thinner than the impurity layer and having a higher impurity concentration than the impurity layer; and a first electrode formed on the contact layer.

According to another aspect of the invention, there is provided an electrode contact section incorporated in a semiconductor device, comprising: a first-conductivity-type semiconductor substrate; a second-conductivity-type impurity layer formed in one surface of the semiconductor substrate; a second-conductivity-type contact layer formed in the impurity layer, being thinner than the impurity layer and having a higher impurity concentration than the impurity layer; a first electrode formed on the contact layer; and a silicide layer formed between the first electrode and the contact layer, the silicide layer having a contact-layer-side end thereof made to substantially correspond to that portion of the contact layer, at which a concentration profile of the contact layer assumes a peak value.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Electrode contact sections each incorporated in a semiconductor device according to the present invention will be described in detail with reference to the accompanying drawings.

[A] First Electrode Contact Section

Figure 1:
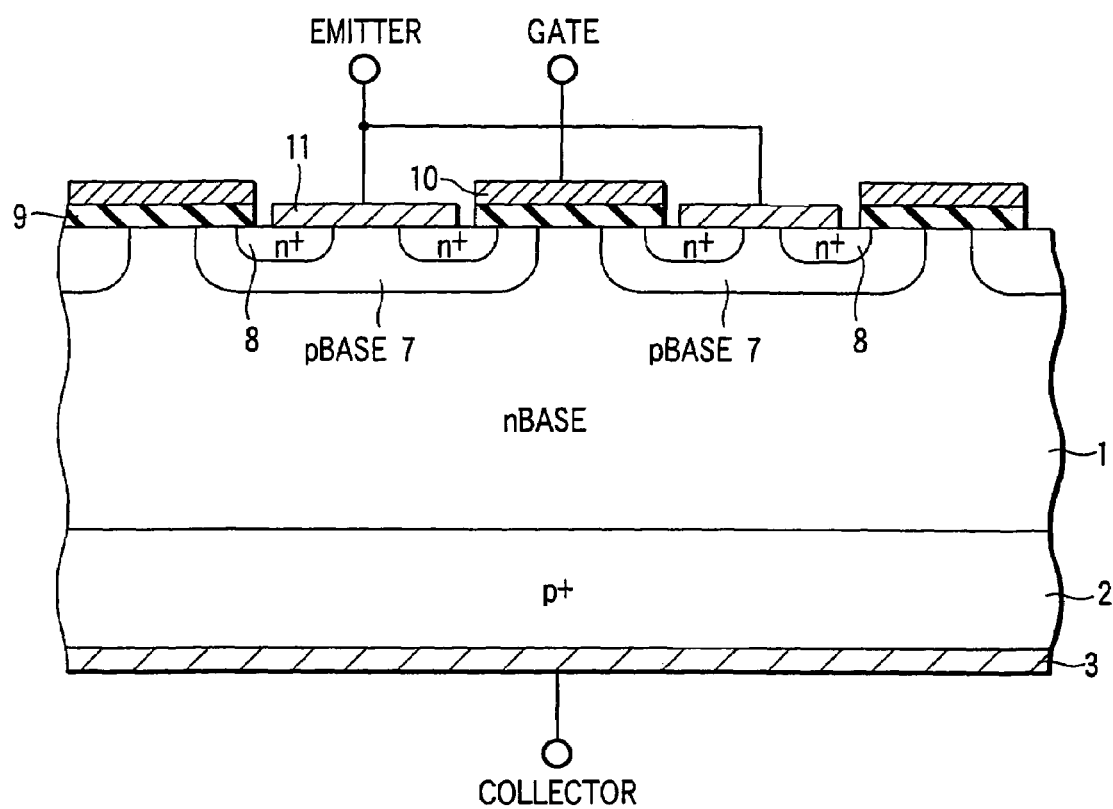
FIG. 1 is a sectional view illustrating an IGBT to which the present invention is applied.
Figure 2:
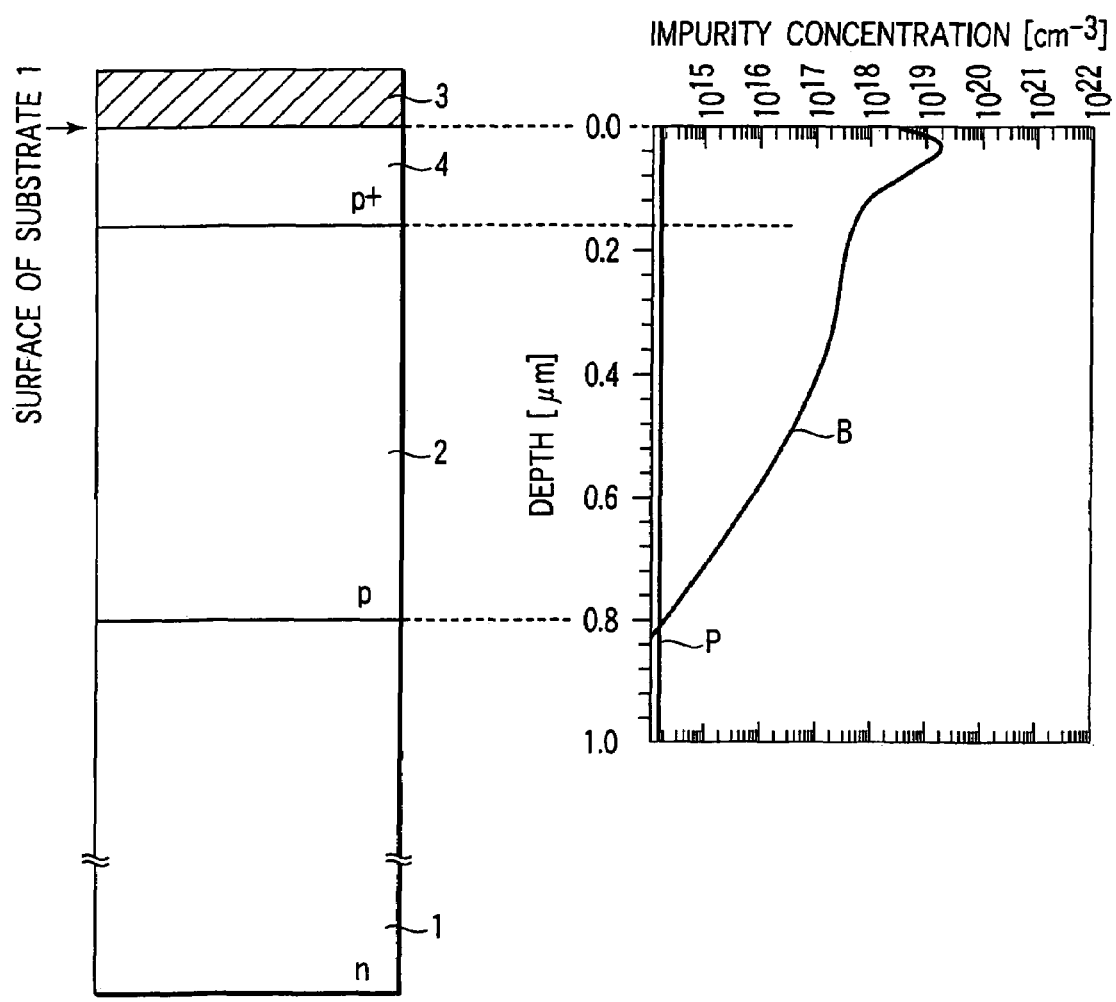
FIG. 2 is a view illustrating an electrode contact section incorporated as an example in a semiconductor device according to the invention.

FIG. 2 shows an electrode contact section incorporated as an example in a semiconductor device according to the invention.

As shown, a p-type impurity layer 2 is formed in an n-type semiconductor substrate 1. The n-type semiconductor layer 1 contains an n-type impurity such as phosphor (P) with a substantially constant concentration of approx. $10^{14}$ ions/$cm^3$. The p-type impurity layer 2 is formed in a surface area of the semiconductor substrate 1 and contains a p-type impurity such as boron (B). The depth of the p-type impurity layer 2 from the surface of the semiconductor substrate 1 is set at 1.0 μm or less, for example, approx. 0.8 μm. Further, the peak value of the concentration profile of the p-type impurity layer 2 is set at a value falling within the range of $10^{17}$-$10^{18}$ ions/$cm^3$.

A $p^+$-type contact layer 4 is formed in the p-type impurity layer 2, and an electrode 3 is formed on the $p^+$-type contact layer 4. The $p^+$-type contact layer 4 is thus interposed between the p-type impurity layer 2 and the electrode 3 and has a higher impurity concentration than the p-type impurity layer 2. For example, the $p^+$-type contact layer 4 contains a p-type impurity such as boron (B) or boron fluoride ($BF_2$), etc., and has an impurity concentration peak value of $10^{19}$ ions/$cm^3$ or more and a surface impurity concentration of $10^{18}$ ions/$cm^3$ or more. The depth of the $p^+$-type contact layer 4 from the surface of the semiconductor substrate 1 is set at 0.2 μm or less, for example, approx. 0.16 μm. The electrode 3 is formed of, for example, aluminum.

In the above-described electrode contact structure, the p-type impurity layer 2 has a low impurity concentration, and a sufficiently shallow depth of 1.0 μm or less from the surface of the semiconductor substrate 1. Accordingly, when this electrode contact structure is applied to the collector (anode) electrode of an IGBT, the coefficient of carrier (positive hole) injection at the time of turning off the semiconductor device can be reduced, thereby increasing the speed of the turn-off operation.

Further, as described above, the $p^+$-type contact layer 4 having a higher impurity concentration than the p-type impurity layer 2 is provided between the p-type impurity layer 2 and the electrode 3. Since the depth of the $p^+$-type contact layer 4 from the surface of the semiconductor substrate 1 is set at 0.2 μm or less, the $p^+$-type contact layer 4 does not influence the carrier injection coefficient at the time of turning off the semiconductor device. In other words, the $p^+$-type contact layer 4 does not increase the carrier injection coefficient.

Moreover, since the $p^+$-type contact layer 4 has a sufficiently high impurity concentration, the contact resistance at the electrode contact section can be reduced.

As described above, the electrode contact section of the invention can have a sufficiently low contact resistance, and simultaneously realize a low carrier injection coefficient when turning off the semiconductor device.

Although in the above example, the semiconductor substrate 1 is of the n-type and the impurity layer 2 and the $p^+$-type contact layer 4 are of the p-type, a similar advantage can be obtained if the semiconductor substrate 1 is made to be of the p-type and the impurity layer 2 and the $p^+$-type contact layer 4 are made to be of the n-type.

A description will now be given of a method for manufacturing the electrode contact section shown in FIG. 2.

First, an n-type semiconductor substrate (e.g. a silicon substrate) 1 having, for example, an impurity concentration of approx. $1.5 \times 10^{14}$ ions/$cm^2$ is prepared. A p-type impurity such as boron (B) is implanted into the semiconductor substrate by ion implantation. At this time, the acceleration voltage and the dose, as implantation conditions, are set at, for example, approx. 60 keV and approx. $1 \times 10^{13}$ ions/$cm^2$, respectively. Thereafter, the resultant structure is subjected to a thermal diffusion process executed in the atmosphere of nitrogen of approx. 1050° C. for approx. 20 min. As a result, a p-type impurity layer (e.g. a p-type emitter layer) 2 having a depth of approx. 0.8 μm from the surface of the semiconductor substrate 1 is formed.

Subsequently, a p-type impurity such as boron (B) is implanted into the p-type impurity layer 2 in the semiconductor substrate 1 by ion implantation. At this time, the acceleration voltage and the dose, as implantation conditions, are set at, for example, approx. 10 keV and approx. $1 \times 10^{14}$ ions/$cm^2$, respectively. After that, the resultant structure is subjected to a thermal diffusion process executed in the atmosphere of nitrogen of approx. 800° C. for approx. 30 min. As a result, a $p^+$-type contact layer 4 having a depth of approx. 0.16 μm from the surface of the semiconductor substrate 1 is formed.

The $p^+$-type contact layer 4 must be formed very shallow, and must have a very high impurity concentration. To this end, the acceleration voltage is set low, the dose is set high, and the period for executing the thermal diffusion process is set short, as is described above.

Boron fluoride ($BF_2$), for example, may be used as the p-type impurity, instead of boron (B) (i.e. the element is changed from a light one to a heavy one), and implanted into the p-type impurity layer 2 in the semiconductor substrate 1, thereby forming a $p^+$-type contact layer 4.

Subsequently, a thermal oxide film formed on a surface portion of the semiconductor substrate 1, i.e. on a surface portion of the $p^+$-type contact layer 4, is removed using antimony fluoride. After that, the electrode 3 made of a metal such as aluminum is provided on the $p^+$-type contact layer 4 by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the electrode 3 into the semiconductor substrate 1, i.e. into the $p^+$-type contact layer 4 so as to reduce the contact resistance of the electrode 3 and the $p^+$-type contact layer 4.

As a result, the electrode contact section according to the invention is completed.

In the electrode contact structure of the invention, the depth and impurity concentration of the p-type impurity layer 2 substantially determine the carrier injection coefficient. In the present example, the peak value of the impurity concentration profile of the p-type impurity layer 2 falls within the range of $10^{17}$-$10^{18}$ ions/cm$^3$, and the depth of the layer 2 is set at a sufficiently low value of 1.0 μm or less. Accordingly, if this structure is applied to the collector electrode of an IGBT, the carrier injection coefficient when turning off the IGBT can be reduced, thereby increasing the speed of the turn-off operation.

In addition, since the p$^+$-type contact layer 4, which has a higher impurity concentration than the p-type impurity layer 2 and is provided between the p-type impurity layer 2 and the electrode 3, is set to have a depth of 0.2 μm or less from the surface of the semiconductor substrate 1, it does not influence the carrier injection coefficient at the time of turning off the semiconductor device. In other words, the p$^+$-type contact layer 4 does not increase the carrier injection coefficient. Further, since the peak value of the impurity concentration profile of the p$^+$-type contact layer 4 is set at approx. $10^{19}$ ions/cm$^3$, the contact resistance of the electrode-contact section is also reduced.

[B] Second Electrode Contact Section

In the above-described electrode contact section having a first impurity profile, the p-type impurity layer 2 is made to be sufficiently shallow (1.0 μm or less) and have a low concentration ($10^{17}$-$10^{18}$ ions/cm$^3$), and the p$^+$-type contact layer 4 interposed between the p-type impurity layer 2 and the electrode 3 has a sufficiently high impurity concentration (approx. $10^{19}$ ions/cm$^3$). This structure simultaneously realizes a low contact resistance and a low carrier injection coefficient.

However, when forming the p$^+$-type contact layer 4 by ion implantation, its surface impurity concentration is lower than the peak value of its impurity profile. In this state, the contact resistance of the electrode contact section cannot sufficiently be reduced.

In light of this, in the second example of the invention, a silicide layer 5 is formed between the electrode 3 and the p$^+$-type contact layer 4.

This example is not characterized by the provision of the silicide layer 5, but by the depth of the silicide layer 5 from the surface of the semiconductor substrate 1, more specifically, by the relationship between the depth of the silicide layer 5 from the surface of the semiconductor substrate 1, and the peak value of the impurity profile of the p$^+$-type contact layer 4.

An electrode contact section incorporated as a second example in the invention will be described.

Figure 3:
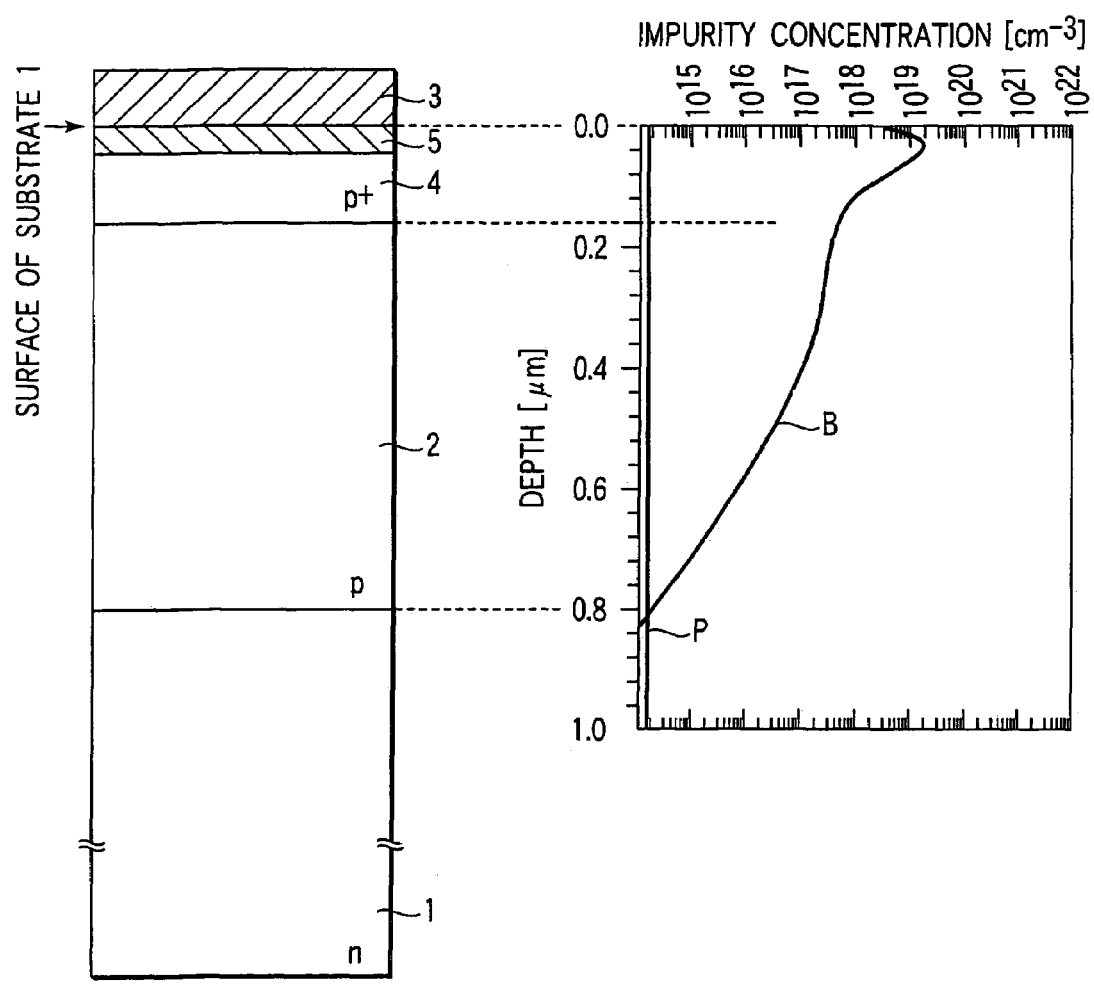
FIG. 3 is a view illustrating an electrode contact section incorporated as a second example in a semiconductor device according to the invention.

FIG. 3 shows the second example.

In this example, a p-type impurity layer 2 is formed in an n-type semiconductor substrate 1. The n-type semiconductor layer 1 contains an n-type impurity such as phosphor (P) with a substantially constant concentration of approx. $10^{14}$ ions/cm$^3$. The p-type impurity layer 2 is formed in a surface area of the semiconductor substrate 1 and contains a p-type impurity such as boron (B). The depth of the p-type impurity layer 2 from the surface of the semiconductor substrate 1 is set at 1.0 μm or less, for example, approx. 0.8 μm. Further, the peak value of the concentration profile of the p-type impurity layer 2 is set at a value falling within the range of $10^{17}$-$10^{18}$ ions/cm$^3$.

A p$^+$-type contact layer 4 is formed in the p-type impurity layer 2, and an electrode 3 is formed on the p$^+$-type contact layer 4. The p$^+$-type contact layer 4 is thus interposed between the p-type impurity layer 2 and the electrode 3 and has a higher impurity concentration than the p-type impurity layer 2. For example, the p$^+$-type contact layer 4 contains a p-type impurity such as boron (B) or boron fluoride (BF$_2$), etc., and has an impurity concentration peak value of $10^{19}$ ions/cm$^3$ or more and a surface impurity concentration of $10^{18}$ ions/cm$^3$ or more. The depth of the p$^+$-type contact layer 4 from the surface of the semiconductor substrate 1 is set at 0.2 μm or less, for example, approx. 0.16 μm. The electrode 3 is formed of, for example, aluminum.

Further, in this example, a silicide layer 5 is provided between the electrode 3 and the p$^+$-type contact layer 4. The silicide layer 5 is formed by, for example, a thermal treatment in which atoms (e.g. aluminum atoms) constituting the electrode 3 react with atoms (silicon atoms) constituting the semiconductor substrate 1.

The depth of the silicide layer 5 from the surface of the semiconductor substrate 1 is set equal to or shallower than the depth of the p$^+$-type contact layer 4 from the surface of the semiconductor substrate 1. In this example, since the depth of the p$^+$-type contact layer 4 from the surface of the semiconductor substrate 1 is set at 0.2 μm or less, the depth of the silicide layer 5 from the surface of the semiconductor substrate 1 is also set at 0.2 μm or less.

To minimize the contact resistance, it is necessary to make the position of the bottom of the silicide layer 5 correspond to that portion of the p$^+$-type contact layer 4, at which the concentration profile of the layer 4 assumes a peak value. In other words, the electrode 3 is electrically connected to the lowest resistance portion of the p$^+$-type contact layer 4 (corresponding to a portion thereof at which the concentration profile assumes the peak value) via the silicide layer 5, thereby reducing the contact resistance.

In the electrode contact structure described above, the p-type impurity layer 2 has a low impurity concentration, and a sufficiently shallow depth of 1.0 μm or less from the surface of the semiconductor substrate 1. Accordingly, if this electrode contact structure is applied to the collector electrode (anode electrode) of an IGBT, the carrier (positive hole) injection coefficient when turning off the IGBT can be reduced, thereby increasing the speed of the turn-off operation.

In addition, since the p$^+$-type contact layer 4, which has a higher impurity concentration than the p-type impurity layer 2 and is provided between the p-type impurity layer 2 and the electrode 3, is set to have a depth of 0.2 μm or less from the surface of the semiconductor substrate 1, it does not influence the carrier injection coefficient at the time of turning off the semiconductor device. In other words, the p$^+$-type contact layer 4 does not increase the carrier injection coefficient.

Further, the p$^+$-type contact layer 4 has a sufficiently high impurity concentration, and the silicide layer 5 is provided between the electrode 3 and the p$^+$-type contact layer 4. The position of the bottom of the silicide layer 5 is made to correspond to that portion of the p$^+$-type contact layer 4, at which the concentration profile of the layer 4 assumes a peak value. Accordingly, the contact resistance of the electrode contact section is further reduced.

Figure 13:
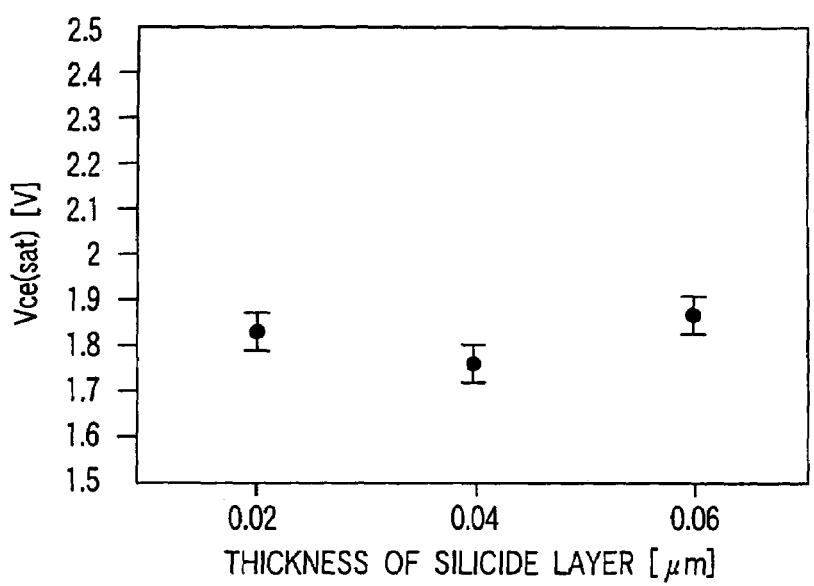
FIG. 13 is a graph illustrating the characteristics of an IGBT according to the invention.

FIG. 13 shows the relationship between a saturation voltage Vce (sat) between the collector and the emitter and the thickness of the silicide layer 5 (the depth from the surface of the semiconductor substrate 1), obtained when the concentration profile of the p$^+$-type contact layer 4 assumes a peak value at a depth of 0.04 μm from the surface of the semiconductor substrate 1.

As is understood from FIG. 13, the saturation voltage Vce (sat) between the collector and the emitter is minimum when the position of the bottom of the silicide layer 5 (i.e. the thickness of the layer 5) corresponds to that portion of the $p^+$-type contact layer 4, at which the concentration profile of the layer 4 assumes the peak value, i.e., when the thickness of the layer 5 is 0.04 μm. This means that the contact resistance is minimum when the position of the bottom of the silicide layer 5 (i.e. the thickness of the layer 5) corresponds to that portion of the $p^+$-type contact layer 4, at which the concentration profile of the layer 4 assumes the peak value.

As described above, the electrode contact section of the invention simultaneously realizes a low contact resistance and a low carrier injection coefficient.

Although in the above-described example, the semiconductor substrate 1 is of the n-type and the impurity layer 2 and the contact layer 4 are of the p-type, the same advantage can be obtained by making the semiconductor substrate 1 be of the p-type and the impurity layer 2 and the contact layer 4 be of the n-type.

A description will be given of a method for manufacturing the electrode contact section shown in FIG. 3.

First, an n-type semiconductor substrate (e.g. a silicon substrate) 1 having, for example, an impurity concentration of approx. $1.5 \times 10^{14}$ ions/cm$^2$ is prepared. A p-type impurity such as boron (B) is implanted into the semiconductor substrate by ion implantation. At this time, the acceleration voltage and the dose, as implantation conditions, are set at, for example, approx. 60 keV and approx. $1 \times 10^{13}$ ions/cm$^2$, respectively. Thereafter, the resultant structure is subjected to a thermal diffusion process executed in the atmosphere of nitrogen of approx. 1050° C. for approx. 20 min. As a result, a p-type impurity layer (e.g. a p-type emitter layer) 2 having a depth of approx. 0.8 μm from the surface of the semiconductor substrate 1 is formed.

Subsequently, a p-type impurity such as boron (B) is implanted into the p-type impurity layer 2 in the semiconductor substrate 1 by ion implantation. At this time, the acceleration voltage and the dose, as implantation conditions, are set at, for example, approx. 10 keV and approx. $1 \times 10^{14}$ ions/cm$^2$, respectively. After that, the resultant structure is subjected to a thermal diffusion process executed in the atmosphere of nitrogen of approx. 800° C. for approx. 30 min. As a result, a $p^+$-type contact layer 4 having a depth of approx. 0.16 μm from the surface of the semiconductor substrate 1 is formed.

The $p^+$-type contact layer 4 must be formed very shallow, and must have a very high impurity concentration. To this end, the acceleration voltage is set low, the dose is set high, and the period for executing the thermal diffusion process is set short, as is described above.

Boron fluoride ($BF_2$), for example, may be used as the p-type impurity, instead of boron (B) (i.e. the element is changed from a light one to a heavy one), and implanted into the p-type impurity layer 2 in the semiconductor substrate 1, thereby forming a $p^+$-type contact layer 4.

Subsequently, a thermal oxide film formed on a surface portion of the semiconductor substrate 1, i.e. on a surface portion of the $p^+$-type contact layer 4, is removed using antimony fluoride. After that, an electrode 3 made of a metal such as aluminum and having a thickness of approx. 0.05 μm is provided on the $p^+$-type contact layer 4 by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the electrode 3 into the semiconductor substrate 1, i.e. into the $p^+$-type contact layer 4. As a result, a silicide layer 5 is formed. The thickness of the silicide layer 5 (the depth from the surface of the semiconductor substrate 1) is made substantially equal to that thickness of the $p^+$-type contact layer 4 from the surface of the semiconductor substrate 1, at which the concentration profile of the layer 4 assumes a peak value.

For example, when the concentration profile of the layer 4 assumes the peak value at a depth of approx. 0.04 μm from the surface of the semiconductor substrate 1, the silicide layer 5 is made to have a thickness of approx. 0.04 μm.

As a result, the contact resistance between the electrode 3 and the p-type impurity layer 2 in the electrode contact section is minimized.

Thus, the electrode contact section of the invention is completed.

In the electrode contact structure of the invention, the carrier injection coefficient is basically determined from the depth and impurity concentration of the p-type impurity layer 2. In this example, the peak value of the concentration profile of the p-type impurity layer 2 is set at a value falling within the range of $10^{17}$-$10^{18}$ ions/cm$^3$. Further, the depth of the p-type impurity layer 2 from the surface of the semiconductor substrate 1 is set at a sufficient low value of 1.0 μm or less. Accordingly, when this electrode contact structure is applied to the collector electrode of an IGBT, the coefficient of carrier injection at the time of turning off the semiconductor device can be reduced, thereby increasing the speed of the turn-off operation.

Further, as described above, the $p^+$-type contact layer 4 having a higher impurity concentration than the p-type impurity layer 2 is provided between the p-type impurity layer 2 and the electrode 3. Since the depth of the $p^+$-type contact layer 4 from the surface of the semiconductor substrate 1 is set at 0.2 μm or less, the $p^+$-type contact layer 4 does not influence the carrier injection coefficient at the time of turning off the semiconductor device. In other words, the $p^+$-type contact layer 4 does not increase the carrier injection coefficient. Moreover, since the peak value of the impurity concentration profile of the $p^+$-type contact layer 4 is set at approx. $10^{19}$ ions/cm$^3$, the contact resistance of the electrode contact section is also reduced.

In addition, the $p^+$-type contact layer 4 has a sufficiently high impurity concentration, and the silicide layer 5 is provided between the electrode 3 and the $p^+$-type contact layer 4. Further, the position of the bottom of the silicide layer 5 is made to correspond to that portion of the $p^+$-type contact layer 4, at which the concentration profile of the layer 4 assumes a peak value. Accordingly, the contact resistance of the electrode contact section is further reduced.

[C] Embodiment

A description will now be given of the case of applying the above-described electrode contact section (according to the first or second example) to an IGBT.

First, the IGBT will be described.

Figure 4:
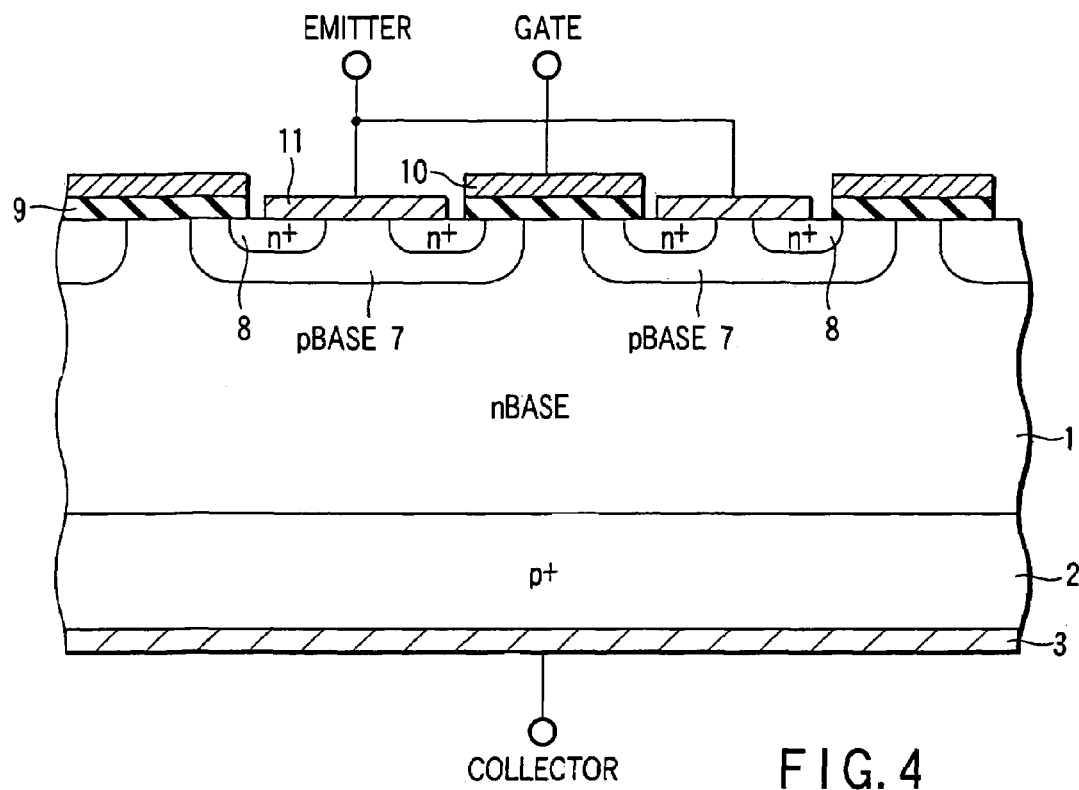
FIG. 4 is a sectional view illustrating an IGBT to which the present invention is applied.

FIG. 4 shows a general structure for the IGBT.

An n-type semiconductor substrate (silicon substrate) 1 serves as an n-type base layer. A p-type base layer 7 is formed on one surface of the semiconductor substrate 1, and an $n^+$-type emitter layer 8 is formed in the p-type base layer 7.

In a surface area of the one surface of the semiconductor substrate 1, a gate electrode 10 is formed on the p-type base layer (channel section) 7 between the n-type base layer 1 and the $n^+$-type emitter layer 8, with an insulating layer 9 interposed therebetween. Further, an emitter electrode 11 is formed on the p-type base layer 7 and the $n^+$-type emitter layer 8.

A p$^+$-type emitter layer 2 is formed on the other surface of the semiconductor substrate 1. The p$^+$-type emitter layer 2 serves as a p-type impurity layer that constitutes an electrode contact section according to the invention. A collector electrode 3 is formed on the p$^+$-type emitter layer 2.

As described above, in the IGBT, it is important to reduce the contact resistance of the p$^+$-type emitter layer 2 and the collector electrode 3, and also to reduce the coefficient of carrier (positive hole) injection from the p$^+$-type emitter layer 2 to the n-type base layer 1 so as to increase the speed of the turn-off operation.

The application of the electrode contact structure of the invention to the IGBT enables the simultaneous realization of a reduction of the contact resistance and the carrier injection coefficient.

Figure 5:
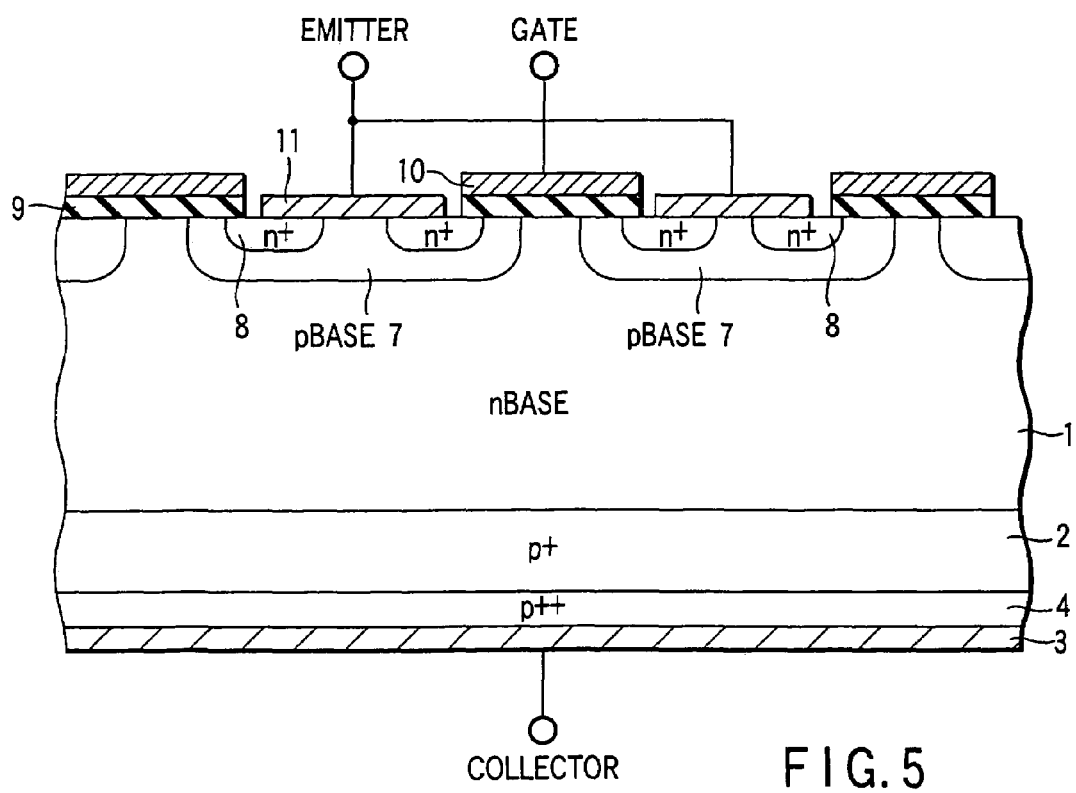
FIG. 5 is a sectional view illustrating an IGBT structure as a first example according to the invention.

FIG. 5 shows an IGBT as a first example of the invention.

This example relates to an IGBT to which the above-described first electrode contact section is applied.

A p-type base layer 7 is formed on one surface of an n-type semiconductor substrate (n-type base layer) 1, and an n$^+$-type emitter layer 8 is formed in the p-type base layer 7. In a surface area of the one surface of the semiconductor substrate 1, a gate electrode 10 is formed on the p-type base layer (channel section) 7 between the n-type base layer 1 and the n$^+$-type emitter layer 8, with an insulating layer 9 interposed therebetween. Further, an emitter electrode 11 is formed on the p-type base layer 7 and the n$^+$-type emitter layer 8.

A p$^+$-type emitter layer 2 is formed on the other surface of the semiconductor substrate 1. The p$^+$-type emitter layer 2 contains a p-type impurity such as boron (B). The depth of the p$^+$-type emitter layer 2 from the other surface of the semiconductor substrate 1 is set at 1.0 µm or less, for example, approx. 0.8 µm. Further, the peak value of the concentration profile of the p$^+$-type emitter layer 2 is set at a value falling within the range of $10^{17}$-$10^{18}$ ions/cm$^3$.

A p$^{++}$-type contact layer 4 is formed in the p$^+$-type emitter layer 2, and a collector electrode 3 is formed on the p$^{++}$-type contact layer 4. The p$^{++}$-type contact layer 4 is thus interposed between the p$^+$-type emitter layer 2 and the collector electrode 3 and has a higher impurity concentration than the p$^+$-type emitter layer 2.

For example, the p$^{++}$-type contact layer 4 contains a p-type impurity such as boron (B) or boron fluoride (BF$_2$), etc., and has an impurity concentration peak value of $10^{19}$ ions/cm$^3$ or more and a surface impurity concentration of $10^{18}$ ions/cm$^3$ or more. The depth of the p$^{++}$-type contact layer 4 from the surface of the semiconductor substrate 1 is set at 0.2 µm or less, for example, approx. 0.16 µm. The collector electrode 3 is formed of, for example, aluminum.

In the above-described electrode contact structure, the p$^+$-type emitter layer 2 has a low impurity concentration, and a sufficiently shallow depth of 1.0 µm or less from the surface of the semiconductor substrate 1. Accordingly, the coefficient of carrier (positive hole) injection at the time of turning off the IGBT can be reduced, thereby increasing the speed of the turn-off operation.

Further, as described above, the p$^{++}$-type contact layer 4 having a higher impurity concentration than the p$^+$-type emitter layer 2 is provided between the p$^+$-type emitter layer 2 and the collector electrode 3. Since the depth of the p$^{++}$-type contact layer 4 from the surface of the semiconductor substrate 1 is set at 0.2 µm or less, the p$^+$-type contact layer 4 does not influence the carrier injection coefficient at the time of turning off the IGBT. In other words, the p$^{++}$-type contact layer 4 does not increase the carrier injection coefficient.

Moreover, since the p$^+$-type contact layer 4 has a sufficiently high impurity concentration, the contact resistance of the electrode contact section is reduced.

As described above, the electrode contact section of the IGBT enables the simultaneous realization of a sufficient reduction of the contact resistance and reduction of the carrier injection coefficient.

Although in the above-described example, the semiconductor substrate 1 is of the n-type and the emitter layer 2 and the contact layer 4 are of the p-type, the same advantage can be obtained by making the semiconductor substrate 1 be of the p-type and the emitter layer 2 and the contact layer 4 be of the n-type.

A method for manufacturing the IGBT shown in FIG. 5 will be described.

First, an n-type semiconductor substrate (e.g. a silicon substrate) 1 having, for example, an impurity concentration of approx. 1.5×10$^{14}$ ions/cm$^2$ is prepared. A p-type base layer 7, an n$^+$-type emitter layer 8, an insulating film 9, a gate electrode 10 and an emitter electrode 11 are formed on one surface of the semiconductor substrate 1.

Subsequently, a p-type impurity such as boron (B) is implanted into the other surface of the semiconductor substrate 1 by ion implantation. At this time, the acceleration voltage and the dose, as implantation conditions, are set at, for example, approx. 60 keV and approx. 1×10$^{13}$ ions/cm$^2$, respectively. Thereafter, the resultant structure is subjected to a thermal diffusion process executed in the atmosphere of nitrogen of approx. 1050° C. for approx. 20 min. As a result, a p$^+$-type emitter layer 2 having a depth of approx. 0.8 µm from the other surface of the semiconductor substrate 1 is formed.

Subsequently, a p-type impurity such as boron (B) is implanted into the p$^+$-type emitter layer 2 in the other surface of the semiconductor substrate 1 by ion implantation. At this time, the acceleration voltage and the dose, as implantation conditions, are set at, for example, approx. 10 keV and approx. 1×10$^{14}$ ions/cm$^2$, respectively. After that, the resultant structure is subjected to a thermal diffusion process executed in the atmosphere of nitrogen of approx. 800° C. for approx. 30 min. As a result, a p$^{++}$-type contact layer 4 having a depth of approx. 0.16 µm from the other surface of the semiconductor substrate 1 is formed.

The p$^{++}$-type contact layer 4 must be formed very shallow, and must have a very high impurity concentration. To this end, the acceleration voltage is set low, the dose is set high, and the period for executing the thermal diffusion process is set short, as is described above.

Boron fluoride (BF$_2$), for example, may be used as the p-type impurity, instead of boron (B) (i.e. the element is changed from a light one to a heavy one), and implanted into the p$^+$-type emitter layer 2 in the semiconductor substrate 1, thereby forming a p$^{++}$-type contact layer 4.

Subsequently, a thermal oxide film formed on a surface portion of the other surface of the semiconductor substrate 1, i.e. on a surface portion of the p$^{++}$-type contact layer 4, is removed using antimony fluoride. After that, a collector electrode 3 made of a metal such as aluminum is provided on the p$^{++}$-type contact layer 4 by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the collector electrode 3 into the semiconductor substrate 1, i.e. into the p$^{++}$-type contact layer 4 so as to reduce the contact resistance of the collector electrode 3 and the p$^{++}$-type contact layer 4.

As a result, the IGBT according to the invention is completed.

Figure 6:
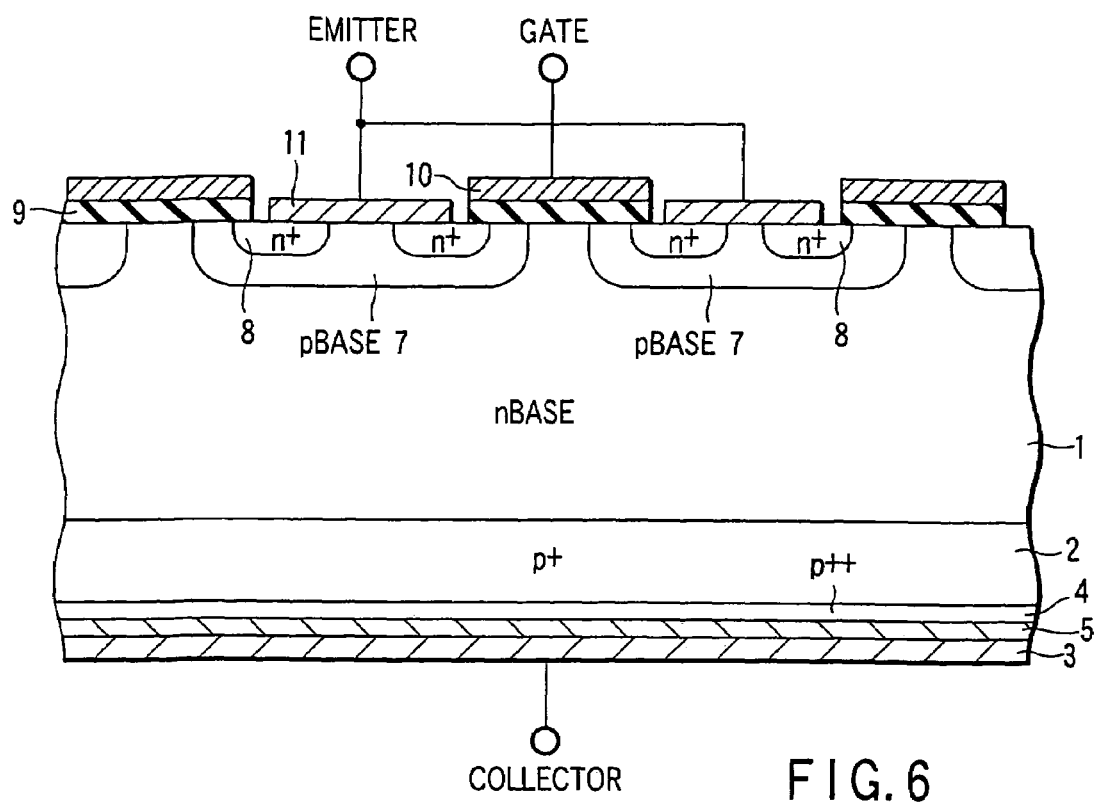
FIG. 6 is a sectional view illustrating an IGBT structure as a second example according to the invention.

FIG. 6 shows an IGBT as a second example of the invention.

This example relates to an IGBT to which the above-described second electrode contact section is applied.

A p-type base layer 7 is formed on one surface of an n-type semiconductor substrate (n-type base layer) 1, and an n$^+$-type emitter layer 8 is formed in the p-type base layer 7. In a surface area of the one surface of the semiconductor substrate 1, a gate electrode 10 is formed on the p-type base layer (channel section) 7 between the n-type base layer 1 and the n$^+$-type emitter layer 8, with an insulating layer 9 interposed therebetween. Further, an emitter electrode 11 is formed on the p-type base layer 7 and the n$^+$-type emitter layer 8.

A p$^+$-type emitter layer 2 is formed on the other surface of the semiconductor substrate 1. The p$^+$-type emitter layer 2 contains a p-type impurity such as boron (B). The depth of the p$^+$-type emitter layer 2 from the other surface of the semiconductor substrate 1 is set at 1.0 μm or less, for example, approx. 0.8 μm. Further, the peak value of the concentration profile of the p$^+$-type emitter layer 2 is set at a value falling within the range of $10^{17}$-$10^{18}$ ions/cm$^3$.

A p$^{++}$-type contact layer 4 is formed in the p$^+$-type emitter layer 2, and a collector electrode 3 is formed on the p$^{++}$-type contact layer 4. The p$^{++}$-type contact layer 4 is thus interposed between the p$^+$-type emitter layer 2 and the collector electrode 3 and has a higher impurity concentration than the p$^+$-type emitter layer 2.

For example, the p$^{++}$-type contact layer 4 contains a p-type impurity such as boron (B) or boron fluoride (BF$_2$), etc., and has an impurity concentration peak value of $10^{19}$ ions/cm$^3$ or more and a surface impurity concentration of $10^{18}$ ions/cm$^3$ or more. The depth of the p$^{++}$-type contact layer 4 from the surface of the semiconductor substrate 1 is set at 0.2 μm or less, for example, approx. 0.16 μm. The collector electrode 3 is formed of, for example, aluminum.

Further, in this example, a silicide layer 5 is provided between the collector electrode 3 and the p$^{++}$-type contact layer 4. The silicide layer 5 is formed by, for example, a thermal treatment in which atoms (e.g. aluminum atoms) constituting the collector electrode 3 react with atoms (silicon atoms) constituting the semiconductor substrate 1.

The depth of the silicide layer 5 from the other surface of the semiconductor substrate 1 is set equal to or shallower than the depth of the p$^{++}$-type contact layer 4 from the other surface of the semiconductor substrate 1. In this example, since the depth of the p$^{++}$-type contact layer 4 from the other surface of the semiconductor substrate 1 is set at 0.2 μm or less, the depth of the silicide layer 5 from the other surface of the semiconductor substrate 1 is also set at 0.2 μm or less.

To minimize the contact resistance, it is necessary to make the position of the bottom of the silicide layer 5 correspond to that portion of the p$^{++}$-type contact layer 4, at which the concentration profile of the layer 4 assumes a peak value. In other words, the collector electrode 3 is electrically connected to the lowest resistance portion of the p$^{++}$-type contact layer 4 (corresponding to a portion thereof at which the concentration profile assumes the peak value) via the silicide layer 5, thereby reducing the contact resistance.

In the electrode contact structure described above, the p$^+$-type emitter layer 2 has a low impurity concentration, and a sufficiently shallow depth of 1.0 μm or less from the other surface of the semiconductor substrate 1. Accordingly, the carrier (positive hole) injection coefficient when turning off the IGBT can be reduced, thereby increasing the speed of the turn-off operation.

In addition, since the p$^{++}$-type contact layer 4, which has a higher impurity concentration than the p$^+$-type emitter layer 2 and is provided between the p$^+$-type emitter layer 2 and the collector electrode 3, is set to have a depth of 0.2 μm or less from the surface of the semiconductor substrate 1, it does not influence the carrier injection coefficient at the time of turning off the IGBT. In other words, the p$^{++}$-type contact layer 4 does not increase the carrier injection coefficient.

Further, the p$^{++}$-type contact layer 4 has a sufficiently high impurity concentration, and the silicide layer 5 is provided between the collector electrode 3 and the p$^{++}$-type contact layer 4. The position of the bottom of the silicide layer 5 is made to correspond to that portion of the p$^{++}$-type contact layer 4, at which the concentration profile of the layer 4 assumes a peak value. Accordingly, the contact resistance of the electrode contact section is further reduced.

Thus, the electrode contact section of the IGBT according to the invention enables the simultaneous realization of a sufficient reduction of the contact resistance and reduction of the carrier injection coefficient.

Although in the above-described example, the semiconductor substrate 1 is of the n-type and the emitter layer 2 and the contact layer 4 are of the p-type, the same advantage can be obtained by making the semiconductor substrate 1 be of the p-type and the emitter layer 2 and the contact layer 4 be of the n-type.

A method for manufacturing the IGBT shown in FIG. 6 will be described.

First, an n-type semiconductor substrate (e.g. a silicon substrate) 1 having, for example, an impurity concentration of approx. $1.5 \times 10^{14}$ ions/cm$^2$ is prepared. A p-type base layer 7, an n$^+$-type emitter layer 8, an insulating film 9, a gate electrode 10 and an emitter electrode 11 are formed on one surface of the semiconductor substrate 1.

Subsequently, a p-type impurity such as boron (B) is implanted into the other surface of the semiconductor substrate 1 by ion implantation. At this time, the acceleration voltage and the dose, as implantation conditions, are set at, for example, approx. 60 keV and approx. $1 \times 10^{13}$ ions/cm$^2$, respectively. Thereafter, the resultant structure is subjected to a thermal diffusion process executed in the atmosphere of nitrogen of approx. 1050° C. for approx. 20 min. As a result, a p$^+$-type emitter layer 2 having a depth of approx. 0.8 μm from the other surface of the semiconductor substrate 1 is formed.

Subsequently, a p-type impurity such as boron (B) is implanted into the p$^+$-type emitter layer 2 in the other surface of the semiconductor substrate 1 by ion implantation. At this time, the acceleration voltage and the dose, as implantation conditions, are set at, for example, approx. 10 keV and approx. $1 \times 10^{14}$ ions/cm$^2$, respectively. After that, the resultant structure is subjected to a thermal diffusion process executed in the atmosphere of nitrogen of approx. 800° C. for approx. 30 min. As a result, a p$^{++}$-type contact layer 4 having a depth of approx. 0.16 μm from the other surface of the semiconductor substrate 1 is formed.

The p$^{++}$-type contact layer 4 must be formed very shallow, and must have a very high impurity concentration. To this end, the acceleration voltage is set low, the dose is set high, and the period for executing the thermal diffusion process is set short, as is described above.

Boron fluoride (BF$_2$), for example, may be used as the p-type impurity, instead of boron (B) (i.e. the element is changed from a light one to a heavy one), and implanted into the p$^+$-type emitter layer 2 in the semiconductor substrate 1, thereby forming a p$^{++}$-type contact layer 4.

Subsequently, a thermal oxide film formed on a surface portion of the other surface of the semiconductor substrate 1, i.e. on a surface portion of the p$^{++}$-type contact layer 4, is removed using antimony fluoride. After that, a collector electrode 3 made of a metal such as aluminum and having a thickness of approx. 0.05 µm is provided on the p$^{++}$-type contact layer 4 by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the collector electrode 3 into the semiconductor substrate 1, i.e. into the p$^{++}$-type contact layer 4 so as to form a silicide layer 5. The thickness of the silicide layer 5 (the depth from the other surface of the semiconductor substrate 1) is made substantially equal to that thickness of the p$^{++}$-type contact layer 4 from the other surface of the semiconductor substrate 1, at which the concentration profile of the layer 4 assumes a peak value.

For example, when the concentration profile of the layer 4 assumes the peak value at a depth of approx. 0.04 µm from the other surface of the semiconductor substrate 1, the silicide layer 5 is made to have a thickness of approx. 0.04 µm.

As a result, the contact resistance between the collector electrode 3 and the p$^+$-type emitter layer 2 in the electrode contact section is reduced.

The collector electrode 3 may be formed after forming the silicide layer 5.

Thus, the IGBT according to the invention is completed.

Figure 8:
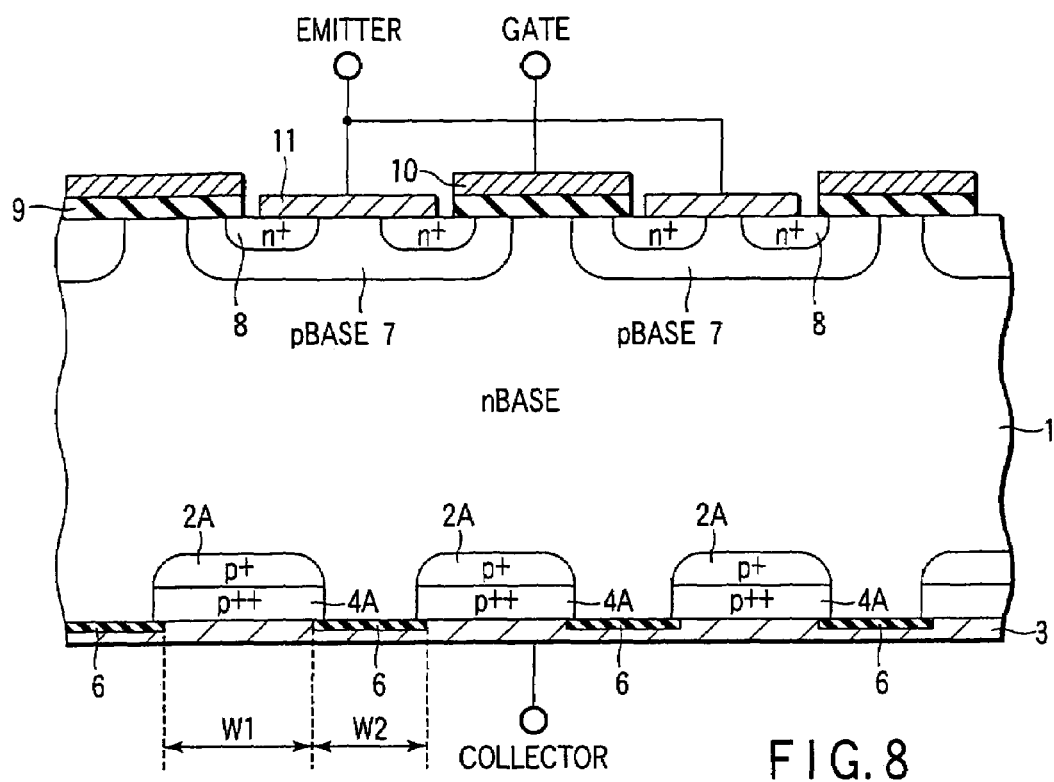
FIG. 8 is a sectional view illustrating an IGBT structure as a third example according to the invention.

FIG. 8 shows an IGBT as a third example of the invention.

Figure 7:
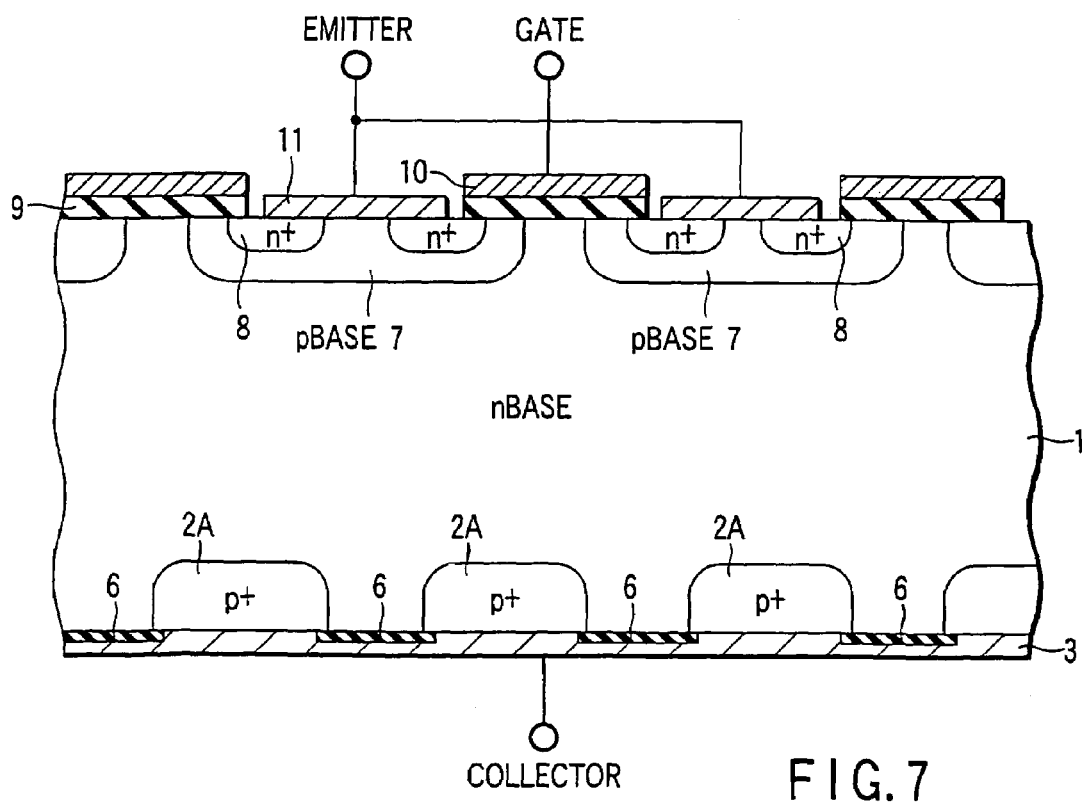
FIG. 7 is a sectional view illustrating an IGBT to which the present invention is applied.

This example relates to an IGBT (a reference example) as shown in FIG. 7, in which a plurality of p$^+$-type emitter layers 2A isolated from each other are formed, and to which the above-described first electrode contact section is applied.

A p-type base layer 7 is formed on one surface of an n-type semiconductor substrate (n-type base layer) 1, and an n$^+$-type emitter layer 8 is formed in the p-type base layer 7. In a surface area of the one surface of the semiconductor substrate 1, a gate electrode 10 is formed on the p-type base layer (channel section) 7 between the n-type base layer 1 and the n$^+$-type emitter layer 8, with an insulating layer 9 interposed therebetween. Further, an emitter electrode 11 is formed on the p-type base layer 7 and the n$^+$-type emitter layer 8.

A plurality of p$^+$-type emitter layers 2A isolated from other are formed on the other surface of the semiconductor substrate 1. Each p$^+$-type emitter layer 2A contains a p-type impurity such as boron (B). The depth of each p$^+$-type emitter layer 2A from the other surface of the semiconductor substrate 1 is set at 1.0 µm or less, for example, approx. 0.8 µm. Further, the peak value of the concentration profile of each p$^+$-type emitter layer 2A is set at a value falling within the range of $10^{17}$-$10^{18}$ ions/cm$^3$.

A p$^{++}$-type contact layer 4A is formed in each p$^+$-type emitter layer 2A, and a collector electrode 3 is formed on the resultant p$^{++}$-type contact layers 4A. Further, insulating films 6 are formed on respective exposed portions of the other surface of the n-type base layer (semiconductor substrate) 1. Accordingly, the collector electrode 3 is electrically connected to the plurality of p$^+$-type emitter layers 2A, and electrically isolated from the n-type base layer 1.

The p$^{++}$-type contact layers 4A are interposed between the respective p$^+$-type emitter layers 2A and the collector electrode 3, and have a higher impurity concentration than the p$^+$-type emitter layers 2A.

For example, each p$^{++}$-type contact layer 4A contains a p-type impurity such as boron (B) or boron fluoride (BF$_2$), etc., and has an impurity concentration peak value of $10^{19}$ ions/cm$^3$ or more and a surface impurity concentration of $10^{18}$ ions/cm$^3$ or more. The depth of each p$^{++}$-type contact layer 4A from the other surface of the semiconductor substrate 1 is set at 0.2 µm or less, for example, approx. 0.16 µm. The collector electrode 3 is formed of, for example, aluminum.

In the electrode contact structure described above, the p$^+$-type emitter layers 2A have a low impurity concentration, and a sufficiently shallow depth of 1.0 µm or less from the other surface of the semiconductor substrate 1. Accordingly, the carrier (positive hole) injection coefficient when turning off the IGBT can be reduced, thereby increasing the speed of the turn-off operation.

The carrier injection coefficient can be controlled by changing the depth of the p$^+$-type emitter layers 2A or contact ratio W1/W2.

In addition, since the p$^{++}$-type contact layers 4, which have a higher impurity concentration than the p$^+$-type emitter layers 2A and are provided between the respective p$^+$-type emitter layers 2A and the collector electrode 3, are set to have a depth of 0.2 µm or less from the other surface of the semiconductor substrate 1, they do not influence the carrier injection coefficient at the time of turning off the IGBT. In other words, the p$^{++}$-type contact layers 4A do not increase the carrier injection coefficient.

Further, since the p$^{++}$-type contact layers 4 have a sufficiently high impurity concentration, the contact resistance of the electrode contact section is reduced.

Thus, the electrode contact section of the IGBT according to the invention enables the simultaneous realization of a sufficient reduction of the contact resistance and reduction of the carrier injection coefficient.

Although in the above-described example, the semiconductor substrate 1 is of the n-type and the emitter layers 2A and the contact layers 4A are of the p-type, the same advantage can be obtained by making the semiconductor substrate 1 be of the p-type and the emitter layers 2A and the contact layers 4A be of the n-type.

A method for manufacturing the IGBT shown in FIG. 8 will be described.

First, an n-type semiconductor substrate (e.g. a silicon substrate) 1 having, for example, an impurity concentration of approx. $1.5 \times 10^{14}$ ions/cm$^2$ is prepared. A p-type base layer 7, an n$^+$-type emitter layer 8, an insulating film 9, a gate electrode 10 and an emitter electrode 11 are formed on one surface of the semiconductor substrate 1.

Subsequently, a p-type impurity such as boron (B) is implanted into the other surface of the semiconductor substrate 1 by ion implantation. At this time, the acceleration voltage and the dose, as implantation conditions, are set at, for example, approx. 60 keV and approx. $1 \times 10^{13}$ ions/cm$^2$, respectively. Thereafter, the resultant structure is subjected to a thermal diffusion process executed in the atmosphere of nitrogen of approx. 1050° C. for approx. 20 min. As a result, p$^+$-type emitter layers 2A having a depth of approx. 0.8 µm from the other surface of the semiconductor substrate 1 are formed.

Subsequently, a p-type impurity such as boron (B) is implanted into the p$^+$-type emitter layers 2A in the other surface of the semiconductor substrate 1 by ion implantation. At this time, the acceleration voltage and the dose, as implantation conditions, are set at, for example, approx. 10 keV and approx. $1 \times 10^{14}$ ions/cm$^2$, respectively. After that, the resultant structure is subjected to a thermal diffusion process executed in the atmosphere of nitrogen of approx. 800° C. for approx. 30 min. As a result, p$^{++}$-type contact layers 4A having a depth of approx. 0.16 μm from the other surface of the semiconductor substrate 1 are formed.

The p$^{++}$-type contact layers 4A must be formed very shallow, and must have a very high impurity concentration. To this end, the acceleration voltage is set low, the dose is set high, and the period for executing the thermal diffusion process is set short, as is described above.

Boron fluoride (BF$_2$), for example, may be used as the p-type impurity, instead of boron (B) (i.e. the element is changed from a light one to a heavy one), and implanted into the p$^+$-type emitter layers 2A in the semiconductor substrate 1, thereby forming p$^{++}$-type contact layers 4A.

Subsequently, a thermal oxide film formed on a surface portion of the other surface of the semiconductor substrate 1, i.e. on a surface portion of the p$^{++}$-type contact layers 4A, is removed using antimony fluoride. After that, an insulating film 6 is formed on the other surface side of the semiconductor substrate 1 by, for example, CVD. The insulating film 6 is patterned by PEP or RIE, thereby forming contact holes that extend to the respective p$^{++}$-type contact layers 4A. Then, a collector electrode 3 extending to the p$^{++}$-type contact layers 4A is formed by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the collector electrode 3 into the semiconductor substrate 1, i.e. into the p$^{++}$-type contact layers 4A. As a result, the contact resistance between the collector electrode 3 and the p$^{++}$-type contact layers 4 is reduced.

Thus, the IGBT according to the invention is completed.

Figure 9:
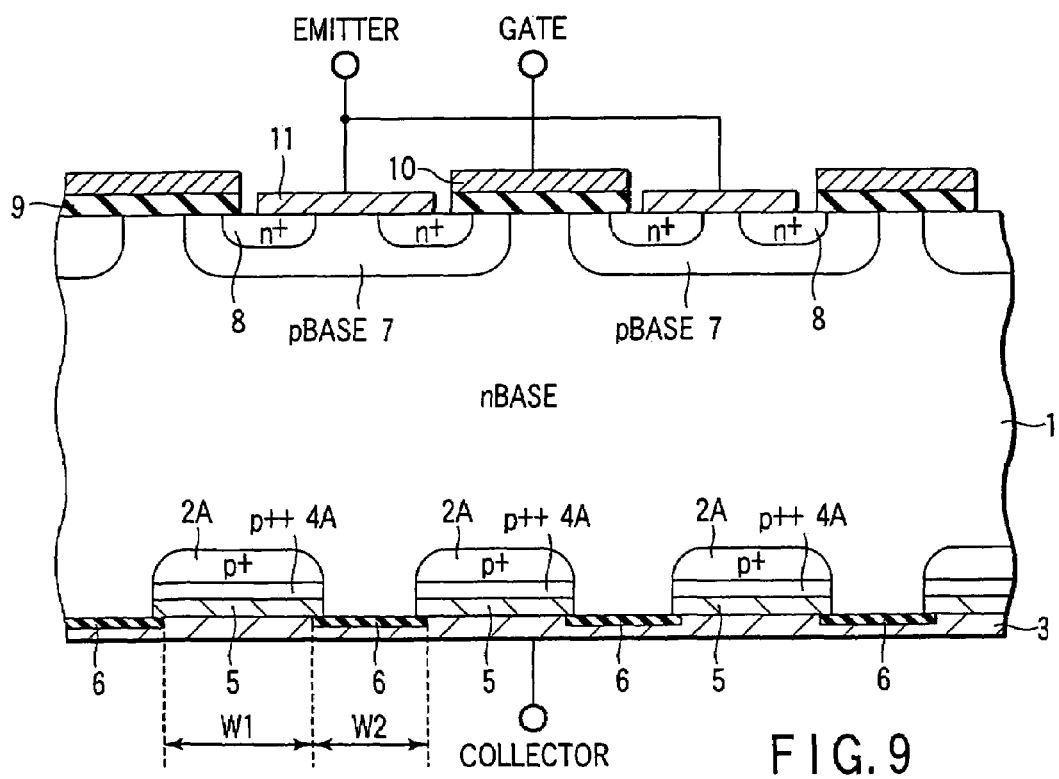
FIG. 9 is a sectional view illustrating an IGBT structure as a fourth example according to the invention.

FIG. 9 shows an IGBT as a fourth example of the invention.

This example relates to an IGBT (a reference example) as shown in FIG. 7, in which a plurality of p$^+$-type emitter layers 2A isolated from each other are formed, and to which the above-described second electrode contact section is applied.

A p-type base layer 7 is formed on one surface of an n-type semiconductor substrate (n-type base layer) 1, and an n$^+$-type emitter layer 8 is formed in the p-type base layer 7. In a surface area of the one surface of the semiconductor substrate 1, a gate electrode 10 is formed on the p-type base layer (channel section) 7 between the n-type base layer 1 and the n$^+$-type emitter layer 8, with an insulating layer 9 interposed therebetween. Further, an emitter electrode 11 is formed on the p-type base layer 7 and the n$^+$-type emitter layer 8.

A plurality of p$^+$-type emitter layers 2A isolated from each other are formed on the other surface of the semiconductor substrate 1. Each p$^+$-type emitter layer 2A contains a p-type impurity such as boron (B). The depth of each p$^+$-type emitter layer 2A from the other surface of the semiconductor substrate 1 is set at 1.0 μm or less, for example, approx. 0.8 μm. Further, the peak value of the concentration profile of each p$^+$-type emitter layer 2A is set at a value falling within the range of $10^{17}$-$10^{18}$ ions/cm$^3$.

A p$^{++}$-type contact layer 4A is formed in each p$^+$-type emitter layer 2A, and a collector electrode 3 is formed on the resultant p$^{++}$-type contact layers 4A. Further, insulating films 6 are formed on respective exposed portions of the other surface of the n-type base layer (semiconductor substrate) 1. Accordingly, the collector electrode 3 is electrically connected to the plurality of p$^+$-type emitter layers 2A, and electrically isolated from the n-type base layer 1.

The p$^{++}$-type contact layers 4A are interposed between the respective p$^+$-type emitter layers 2A and the collector electrode 3, and have a higher impurity concentration than the p$^+$-type emitter layers 2A.

For example, each p$^{++}$-type contact layer 4A contains a p-type impurity such as boron (B) or boron fluoride (BF$_2$), etc., and has an impurity concentration peak value of $10^{19}$ ions/cm$^3$ or more and a surface impurity concentration of $10^{18}$ ions/cm$^3$ or more. The depth of each p$^{++}$-type contact layer 4A from the other surface of the semiconductor substrate 1 is set at 0.2 μm or less, for example, approx. 0.16 μm. The collector electrode 3 is formed of, for example, aluminum.

Further, in this example, a silicide layer 5 is provided between the collector electrode 3 and each p$^+$-type contact layer 4A. The silicide layer 5 is formed by, for example, a thermal treatment in which atoms (e.g. aluminum atoms) constituting the electrode 3 react with atoms (silicon atoms) constituting the semiconductor substrate 1.

The depth of the silicide layer 5 from the other surface of the semiconductor substrate 1 is set equal to or shallower than the depth of each p$^+$-type contact layer 4A from the other surface of the semiconductor substrate 1. In this example, since the depth of each p$^+$-type contact layer 4A from the other surface of the semiconductor substrate 1 is set at 0.2 μm or less, the depth of the silicide layer 5 from the surface of the semiconductor substrate 1 is also set at 0.2 μm or less.

To minimize the contact resistance, it is necessary to make the position of the bottom of the silicide layer 5 correspond to that portion of each p$^+$-type contact layer 4A, at which the concentration profile of the layer 4A assumes a peak value. In other words, the collector electrode 3 is electrically connected to the lowest resistance portion of each p$^+$-type contact layer 4A (corresponding to a portion thereof at which the concentration profile assumes the peak value) via the silicide layer 5, thereby reducing the contact resistance.

In the electrode contact structure described above, the p$^+$-type emitter layers 2A have a low impurity concentration, and a sufficiently shallow depth of 1.0 μm or less from the other surface of the semiconductor substrate 1. Accordingly, the carrier (positive hole) injection coefficient when turning off the IGBT can be reduced, thereby increasing the speed of the turn-off operation.

The carrier injection coefficient can be controlled by changing the depth of the p$^+$-type emitter layers 2A or contact ratio W1/W2.

In addition, since the p$^{++}$-type contact layers 4, which have a higher impurity concentration than the p$^+$-type emitter layers 2A and are provided between the respective p$^+$-type emitter layers 2A and the collector electrode 3, are set to have a depth of 0.2 μm or less from the other surface of the semiconductor substrate 1, they do not influence the carrier injection coefficient at the time of turning off the IGBT. In other words, the p$^{++}$-type contact layers 4A do not increase the carrier injection coefficient.

Further, the p$^{++}$-type contact layers 4 have a sufficiently high impurity concentration, and the silicide layer 5 is provided between the collector electrode 3 and each p$^{++}$-type contact layer 4A. The position of the bottom of the silicide layer 5 is made to correspond to that portion of each p$^{++}$-type contact layer 4A, at which the concentration profile of the layer 4A assumes a peak value. Accordingly, the contact resistance of the electrode contact section is further reduced.

Thus, the electrode contact section of the IGBT according to the invention enables the simultaneous realization of a sufficient reduction of the contact resistance and reduction of the carrier injection coefficient.

Although in the above-described example, the semiconductor substrate 1 is of the n-type and the emitter layers 2A and the contact layers 4A are of the p-type, the same advantage can be obtained by making the semiconductor substrate 1 be of the p-type and the emitter layers 2A and the contact layers 4A be of the n-type.

A method for manufacturing the IGBT shown in FIG. 9 will be described.

First, an n-type semiconductor substrate (e.g. a silicon substrate) 1 having, for example, an impurity concentration of approx. $1.5 \times 10^{14}$ ions/cm$^2$ is prepared. A p-type base layer 7, an n$^+$-type emitter layer 8, an insulating film 9, a gate electrode 10 and an emitter electrode 11 are formed on one surface of the semiconductor substrate 1.

Subsequently, a p-type impurity such as boron (B) is implanted into the other surface of the semiconductor substrate 1 by ion implantation. At this time, the acceleration voltage and the dose, as implantation conditions, are set at, for example, approx. 60 keV and approx. $1 \times 10^{13}$ ions/cm$^2$, respectively. Thereafter, the resultant structure is subjected to a thermal diffusion process executed in the atmosphere of nitrogen of approx. 1050' for approx. 20 min. As a result, p$^+$-type emitter layers 2A having a depth of approx. 0.8 μm from the other surface of the semiconductor substrate 1 are formed.

Thereafter, a p-type impurity such as boron (B) is implanted into the p$^+$-type emitter layers 2A in the other surface of the semiconductor substrate 1 by ion implantation. At this time, the acceleration voltage and the dose, as implantation conditions, are set at, for example, approx. 10 keV and approx. $1 \times 10^{14}$ ions/cm$^2$, respectively. Then, the resultant structure is subjected to a thermal diffusion process executed in the atmosphere of nitrogen of approx. 800° C. for approx. 30 min. As a result, p$^{++}$-type contact layers 4A having a depth of approx. 0.16 μm from the other surface of the semiconductor substrate 1 are formed.

The p$^{++}$-type contact layers 4A must be formed very shallow, and must have a very high impurity concentration. To this end, the acceleration voltage is set low, the dose is set high, and the period for executing the thermal diffusion process is set short, as is described above.

Boron fluoride (BF$_2$), for example, may be used as the p-type impurity, instead of boron (B) (i.e. the element is changed from a light one to a heavy one), and implanted into the p$^+$-type emitter layers 2A in the semiconductor substrate 1, thereby forming p$^{++}$-type contact layers 4A.

Subsequently, a thermal oxide film formed on a surface portion of the other surface of the semiconductor substrate 1, i.e. on a surface portion of the p$^{++}$-type contact layers 4A, is removed using antimony fluoride. After that, an insulating film 6 is formed on the other surface side of the semiconductor substrate 1 by, for example, CVD. The insulating film 6 is patterned by PEP or RIE, thereby forming contact holes that extend to the respective p$^{++}$-type contact layers 4A. Then, a collector electrode 3 extending to the p$^{++}$-type contact layers 4A is formed by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the collector electrode 3 into the semiconductor substrate 1, i.e. into the p$^{++}$-type contact layers 4A, so as to form a silicide layer 5. The thickness of the silicide layer 5 (the depth from the surface of the semiconductor substrate 1) is made substantially equal to that thickness of each p$^+$-type contact layer 4A from the other surface of the semiconductor substrate 1, at which the concentration profile of each layer 4A assumes a peak value.

For example, when the concentration profile of each layer 4A assumes the peak value at a depth of approx. 0.04 μm from the surface of the semiconductor substrate 1, the silicide layer 5 is made to have a thickness of approx. 0.04 μm.

As a result, the contact resistance between the collector electrode 3 and the p$^{++}$-type contact layers 4 is reduced.

The collector electrode 3 may be formed after forming the silicide layer 5.

Thus, the IGBT according to the invention is completed.

Figure 11:
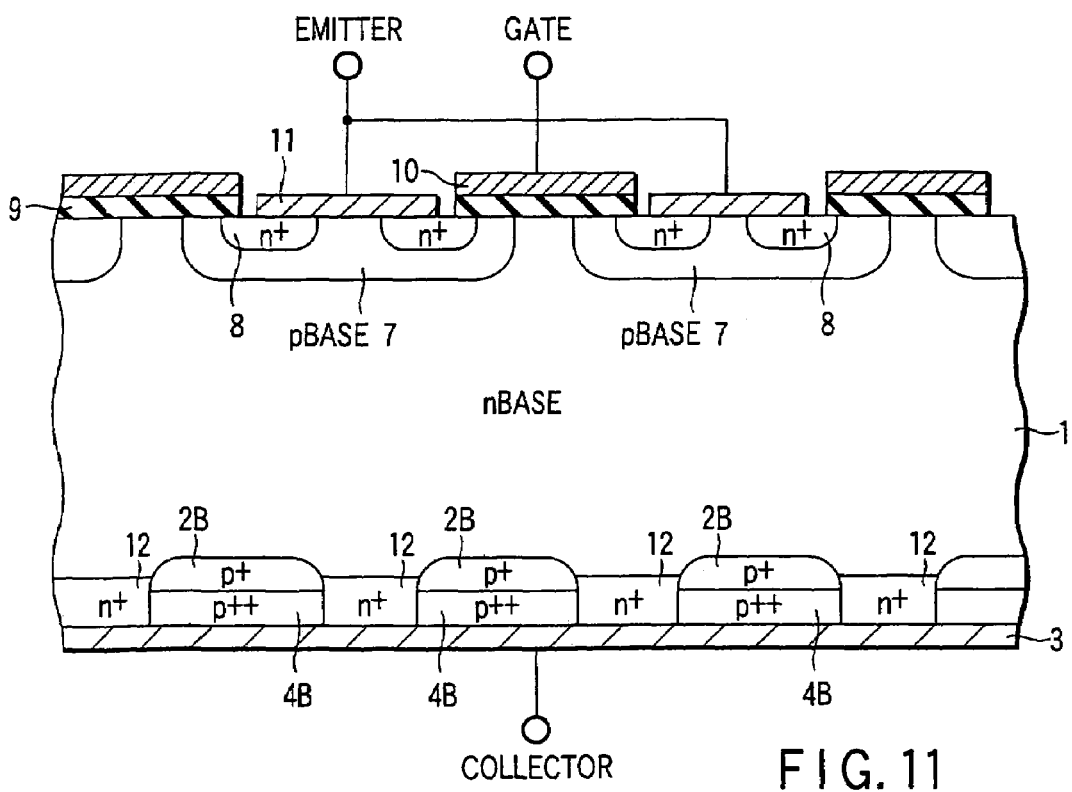
FIG. 11 is a sectional view illustrating an IGBT structure as a fifth example according to the invention.

FIG. 11 shows an IGBT as a fifth example of the invention.

Figure 10:
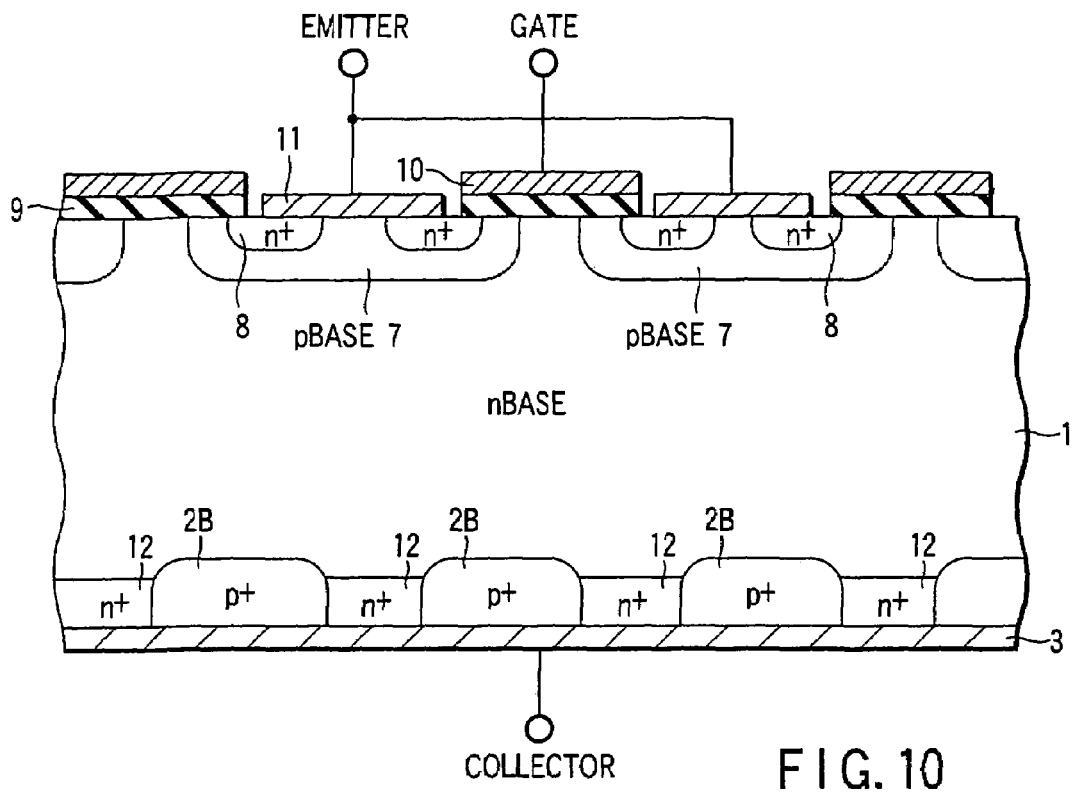
FIG. 10 is a sectional view illustrating an IGBT to which the present invention is applied.

This example relates to a so-called collector-short-circuited (or anode-short-circuited) IGBT (a reference example) as shown in FIG. 10, to which the above-described first electrode contact section is applied.

A p-type base layer 7 is formed on one surface of an n-type semiconductor substrate (n-type base layer) 1, and an n$^+$-type emitter layer 8 is formed in the p-type base layer 7. In a surface area of the one surface of the semiconductor substrate 1, a gate electrode 10 is formed on the p-type base layer (channel section) 7 between the n-type base layer 1 and the n$^+$-type emitter layer 8, with an insulating layer 9 interposed therebetween. Further, an emitter electrode 11 is formed on the p-type base layer 7 and the n$^+$-type emitter layer 8.

A plurality of p$^+$-type emitter layers 2B and a plurality of n$^+$-type base layers 12 are formed on the other surface of the semiconductor substrate 1. Each p$^+$-type emitter layer 2B contains a p-type impurity such as boron (B). The depth of each p$^+$-type emitter layer 2B from the other surface of the semiconductor substrate 1 is set at 1.0 μm or less, for example, approx. 0.8 μm. Further, the peak value of the concentration profile of each p$^+$-type emitter layer 2B is set at a value falling within the range of $10^{17}$-$10^{18}$ ions/cm$^3$.

A p$^{++}$-type contact layer 4B is formed in each p$^+$-type emitter layer 2B, and a collector electrode 3 is formed on the resultant p$^{++}$-type contact layers 4B. Further, the p$^{++}$-type contact layers 4B are interposed between the respective p$^+$-type emitter layers 2B and the collector electrode 3, and have a higher impurity concentration than the p$^+$-type emitter layers 2B.

For example, each p$^{++}$-type contact layer 4B contains a p-type impurity such as boron (B) or boron fluoride (BF$_2$), etc., and has an impurity concentration peak value of $10^{19}$ ions/cm$^3$ or more and a surface impurity concentration of $10^{18}$ ions/cm$^3$ or more. The depth of each p$^{++}$-type contact layer 4B from the other surface of the semiconductor substrate 1 is set at 0.2 μm or less, for example, approx. 0.16 μm. The collector electrode 3 is formed of, for example, aluminum.

In the electrode contact structure described above, the p$^+$-type emitter layers 2B have a low impurity concentration, and a sufficiently shallow depth of 1.0 μm or less from the other surface of the semiconductor substrate 1. Accordingly, the carrier (positive hole) injection coefficient when turning off the IGBT can be reduced, thereby increasing the speed of the turn-off operation.

In addition, since the p$^{++}$-type contact layers 4B, which have a higher impurity concentration than the p$^+$-type emitter layers 2B and are provided between the respective p$^+$-type emitter layers 2B and the collector electrode 3, are set to have a depth of 0.2 μm or less from the other surface of the semiconductor substrate 1, they do not influence the carrier injection coefficient at the time of turning off the IGBT. In other words, the $p^{++}$-type contact layers 4B do not increase the carrier injection coefficient.

Further, since the $p^{++}$-type contact layers 4B have a sufficiently high impurity concentration, the contact resistance of the electrode contact section is reduced.

Thus, the electrode contact section of the IGBT according to the invention enables the simultaneous realization of a sufficient reduction of the contact resistance and reduction of the carrier injection coefficient.

Although in the above-described example, the semiconductor substrate 1 is of the n-type and the emitter layers 2B and the contact layers 4B are of the p-type, the same advantage can be obtained by making the semiconductor substrate 1 be of the p-type and the emitter layers 2B and the contact layers 4B be of the n-type.

A method for manufacturing the IGBT shown in FIG. 11 will be described.

First, an n-type semiconductor substrate (e.g. a silicon substrate) 1 having, for example, an impurity concentration of approx. $1.5 \times 10^{14}$ ions/cm$^2$ is prepared. A p-type base layer 7, an n$^+$-type emitter layer 8, an insulating film 9, a gate electrode 10 and an emitter electrode 11 are formed on one surface of the semiconductor substrate 1.

Subsequently, an n-type impurity such as phosphor (P) is implanted into the other surface of the semiconductor substrate 1 by ion implantation, and subjected to a thermal diffusion treatment, thereby forming an n$^+$-type base layer 12 in a surface portion of the other surface of the semiconductor substrate 1.

Then, a p-type impurity such as boron (B) is implanted into the other surface of the semiconductor substrate 1 by ion implantation. At this time, the acceleration voltage and the dose, as implantation conditions, are set at, for example, approx. 60 keV and approx. $1 \times 10^{13}$ ions/cm$^2$, respectively. Thereafter, the resultant structure is subjected to a thermal diffusion process executed in the atmosphere of nitrogen of approx. 1050° C. for approx. 20 min. As a result, p$^+$-type emitter layers 2B having a depth of approx. 0.8 μm from the other surface of the semiconductor substrate 1 are formed.

Thereafter, a p-type impurity such as boron (B) is implanted into the p$^+$-type emitter layers 2B in the other surface of the semiconductor substrate 1 by ion implantation. At this time, the acceleration voltage and the dose, as implantation conditions, are set at, for example, approx. 10 keV and approx. $1 \times 10^{14}$ ions/cm$^2$, respectively. Then, the resultant structure is subjected to a thermal diffusion process executed in the atmosphere of nitrogen of approx. 800° C. for approx. 30 min. As a result, p$^{++}$-type contact layers 4B having a depth of approx. 0.16 μm from the other surface of the semiconductor substrate 1 are formed.

The p$^{++}$-type contact layers 4B must be formed very shallow, and must have a very high impurity concentration. To this end, the acceleration voltage is set low, the dose is set high, and the period for executing the thermal diffusion process is set short, as is described above.

Boron fluoride (BF$_2$), for example, may be used as the p-type impurity, instead of boron (B) (i.e. the element is changed from a light one to a heavy one), and implanted into the p$^+$-type emitter layers 2B in the semiconductor substrate 1, thereby forming p$^{++}$-type contact layers 4B.

Subsequently, a thermal oxide film formed on a surface portion of the other surface of the semiconductor substrate 1, i.e. on a surface portion of the p$^{++}$-type contact layers 4B, is removed using antimony fluoride. Then, a collector electrode 3 extending to the p$^{++}$-type contact layers 4B and the n$^+$-type base layers 12 is formed by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the collector electrode 3 into the semiconductor substrate 1, i.e. into the p$^{++}$-type contact layers 4B and the n$^+$-type base layers 12, so as to reduce the contact resistance between the collector electrode 3 and the p$^{++}$-type contact layers 4B, and that between the collector electrode 3 and the n$^+$-type base layers 12.

Thus, the IGBT according to the invention is completed.

Figure 12:
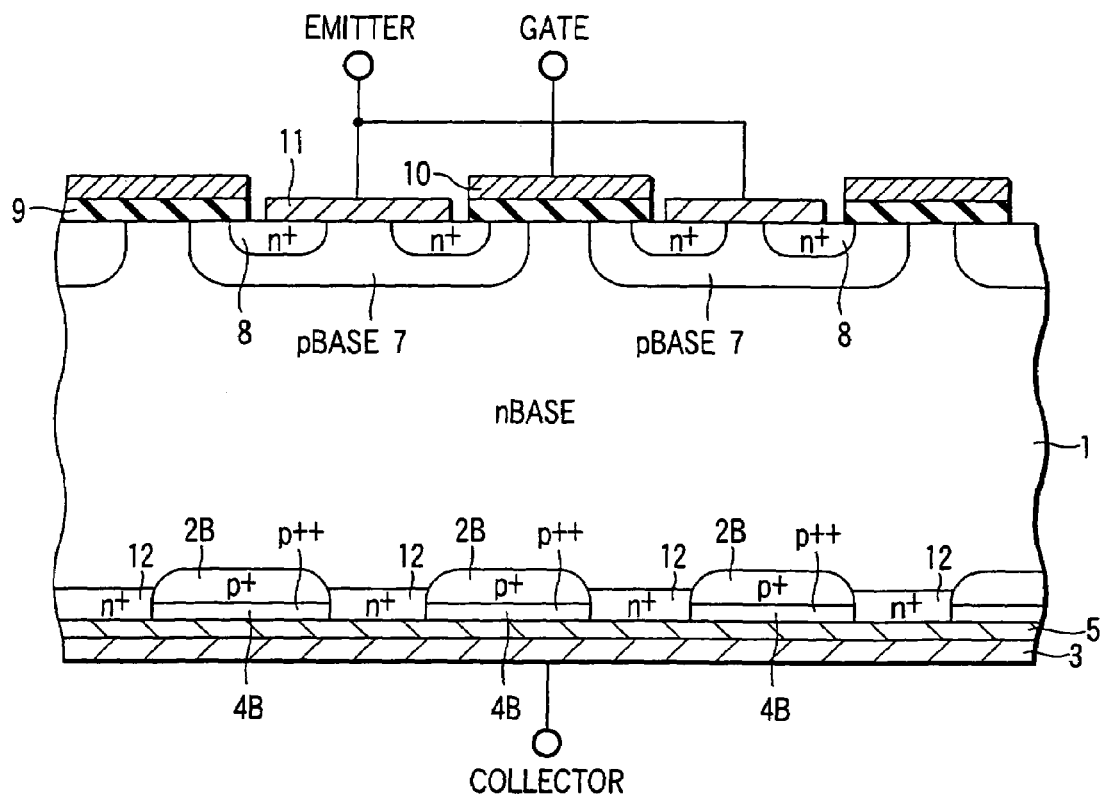
FIG. 12 is a sectional view illustrating an IGBT structure as a sixth example according to the invention.

FIG. 12 shows an IGBT as a sixth example of the invention.

This example relates to a so-called collector-short-circuited (or anode-short-circuited) IGBT (a reference example) as shown in FIG. 10, to which the above-described second electrode contact section is applied.

A p-type base layer 7 is formed on one surface of an n-type semiconductor substrate (n-type base layer) 1, and an n$^+$-type emitter layer 8 is formed in the p-type base layer 7. In a surface area of the one surface of the semiconductor substrate 1, a gate electrode 10 is formed on the p-type base layer (channel section) 7 between the n-type base layer 1 and the n$^+$-type emitter layer 8, with an insulating layer 9 interposed therebetween. Further, an emitter electrode 11 is formed on the p-type base layer 7 and the n$^+$-type emitter layer 8.

A plurality of p$^+$-type emitter layers 2B and a plurality of n$^+$-type base layers 12 are formed on the other surface of the semiconductor substrate 1. Each p$^+$-type emitter layer 2B contains a p-type impurity such as boron (B). The depth of each p$^+$-type emitter layer 2B from the other surface of the semiconductor substrate 1 is set at 1.0 μm or less, for example, approx. 0.8 μm. Further, the peak value of the concentration profile of each p$^+$-type emitter layer 2B is set at a value falling within the range of $10^{17}$-$10^{18}$ ions/cm$^3$.

A p$^{++}$-type contact layer 4B is formed in each p$^+$-type emitter layer 2B, and a collector electrode 3 is formed on the resultant p$^{++}$-type contact layers 4B. Further, the p$^{++}$-type contact layers 4B are interposed between the respective p$^+$-type emitter layers 2B and the collector electrode 3, and have a higher impurity concentration than the p$^+$-type emitter layers 2B.

For example, each p$^{++}$-type contact layer 4B contains a p-type impurity such as boron (B) or boron fluoride (BF$_2$), etc., and has an impurity concentration peak value of 101.9 ions/cm$^3$ or more and a surface impurity concentration of $10^{18}$ ions/cm$^3$ or more. The depth of each p$^{++}$-type contact layer 4B from the other surface of the semiconductor substrate 1 is set at 0.2 μm or less, for example, approx. 0.16 μm. The collector electrode 3 is formed of, for example, aluminum.

Further, in this example, a silicide layer 5 is provided between the collector electrode 3 and each p$^+$-type contact layer 4B and the collector electrode and each n$^+$-type base layer 12. The silicide layer 5 is formed by, for example, a thermal treatment in which atoms (e.g. aluminum atoms) constituting the electrode 3 react with atoms (silicon atoms) constituting the semiconductor substrate 1.

The depth of the silicide layer 5 from the other surface of the semiconductor substrate 1 is set equal to or shallower than the depth of each p$^+$-type contact layer 4B from the other surface of the semiconductor substrate 1. In this example, since the depth of each p$^+$-type contact layer 4B from the other surface of the semiconductor substrate 1 is set at 0.2 μm or less, the depth of the silicide layer 5 from the surface of the semiconductor substrate 1 is also set at 0.2 μm or less.

To minimize the contact resistance, it is necessary to make the position of the bottom of the silicide layer 5 correspond to that portion of each $p^+$-type contact layer 4B, at which the concentration profile of each layer 4B assumes a peak value. In other words, the collector electrode 3 is electrically connected to the lowest resistance portion of each $p^+$-type contact layer 4B (corresponding to a portion thereof at which the concentration profile assumes the peak value) via the silicide layer 5, thereby reducing the contact resistance.

In the electrode contact structure described above, the $p^+$-type emitter layers 2B have a low impurity concentration, and a sufficiently shallow depth of 1.0 μm or less from the other surface of the semiconductor substrate 1. Accordingly, the carrier (positive hole) injection coefficient when turning off the IGBT can be reduced, thereby increasing the speed of the turn-off operation.

In addition, since the $p^{++}$-type contact layers 4B, which have a higher impurity concentration than the $p^+$-type emitter layers 2B and are provided between the respective $p^+$-type emitter layers 2B and the collector electrode 3, are set to have a depth of 0.2 μm or less from the other surface of the semiconductor substrate 1, they do not influence the carrier injection coefficient at the time of turning off the IGBT. In other words, the $p^{++}$-type contact layers 4B do not increase the carrier injection coefficient.

Further, the $p^{++}$-type contact layers 4B have a sufficiently high impurity concentration, and the silicide layer 5 is provided between the collector electrode 3 and each $p^+$-type contact layer 4B and between the collector electrode 3 and each $n^+$-type base layer 12. The position of the bottom of the silicide layer 5 is made to correspond to that portion of each $p^+$-type contact layer 4B, at which the concentration profile of each layer 4B assumes a peak value. Accordingly, the contact resistance of the electrode contact section is further reduced.

Thus, the electrode contact section of the IGBT according to the invention enables the simultaneous realization of a sufficient reduction of the contact resistance and reduction of the carrier injection coefficient.

Although in the above-described example, the semiconductor substrate 1 is of the n-type and the emitter layers 2B and the contact layers 4B are of the p-type, the same advantage can be obtained by making the semiconductor substrate 1 be of the p-type and the emitter layers 2B and the contact layers 4B be of the n-type.

A method for manufacturing the IGBT shown in FIG. 12 will be described.

First, an n-type semiconductor substrate (e.g. a silicon substrate) 1 having, for example, an impurity concentration of approx. $1.5 \times 10^{14}$ ions/cm$^2$ is prepared. A p-type base layer 7, an $n^+$-type emitter layer 8, an insulating film 9, a gate electrode 10 and an emitter electrode 11 are formed on one surface of the semiconductor substrate 1.

Subsequently, an n-type impurity such as phosphor (P) is implanted into the other surface of the semiconductor substrate 1 by ion implantation, and subjected to a thermal diffusion treatment, thereby forming an $n^+$-type base layer 12 in a surface portion of the other surface of the semiconductor substrate 1.

Then, a p-type impurity such as boron (B) is implanted into the other surface of the semiconductor substrate 1 by ion implantation. At this time, the acceleration voltage and the dose, as implantation conditions, are set at, for example, approx. 60 keV and approx. $1 \times 10^{13}$ ions/cm$^2$, respectively. Thereafter, the resultant structure is subjected to a thermal diffusion process executed in the atmosphere of nitrogen of approx. 1050° C. for approx. 20 min. As a result, $p^+$-type emitter layers 2B having a depth of approx. 0.8 μm from the other surface of the semiconductor substrate 1 are formed.

Thereafter, a p-type impurity such as boron (B) is implanted into the $p^+$-type emitter layers 2B in the other surface of the semiconductor substrate 1 by ion implantation. At this time, the acceleration voltage and the dose, as implantation conditions, are set at, for example, approx. 10 keV and approx. $1 \times 10^{14}$ ions/cm$^2$, respectively. Then, the resultant structure is subjected to a thermal diffusion process executed in the atmosphere of nitrogen of approx. 800° C. for approx. 30 min. As a result, $p^{++}$-type contact layers 4B having a depth of approx. 0.16 μm from the other surface of the semiconductor substrate 1 are formed.

The $p^{++}$-type contact layers 4B must be formed very shallow, and must have a very high impurity concentration. To this end, the acceleration voltage is set low, the dose is set high, and the period for executing the thermal diffusion process is set short, as is described above.

Boron fluoride ($BF_2$), for example, may be used as the p-type impurity, instead of boron (B) (i.e. the element is changed from a light one to a heavy one), and implanted into the $p^+$-type emitter layers 2B in the semiconductor substrate 1, thereby forming $p^{++}$-type contact layers 4B.

Subsequently, a thermal oxide film formed on a surface portion of the other surface of the semiconductor substrate 1, i.e. on a surface portion of the $p^{++}$-type contact layers 4B, is removed using antimony fluoride. Then, a collector electrode 3 having a thickness of approx. 0.05 μm is formed on the $p^{++}$-type contact layers 4B and the $n^+$-type base layers 12 by sputtering or CVD.

Thereafter, the resultant structure is subjected to a heat treatment executed for approx. 30 min. in the atmosphere of nitrogen of approx. 450° C., thereby diffusing the atoms (e.g. aluminum atoms) of the collector electrode 3 into the semiconductor substrate 1, i.e. into the $p^{++}$-type contact layers 4B and the $n^+$-type base layers 12, so as to form a silicide layer 5. The thickness of the silicide layer 5 (the depth from the other surface of the semiconductor substrate 1) is made substantially equal to that thickness of each $p^{++}$-type contact layer 4B from the other surface of the semiconductor substrate 1, at which the concentration profile of each layer 4B assumes a peak value.

For example, when the concentration profile of each layer 4B assumes the peak value at a depth of approx. 0.04 μm from the other surface of the semiconductor substrate 1, the silicide layer 5 is made to have a thickness of approx. 0.04 μm.

As a result, the contact resistance between the collector electrode 3 and each $p^+$-type emitter layer 2B in the electrode contact section and between the collector electrode 3 and each $n^+$-type base layer 12 is reduced.

The collector electrode 3 may be formed after forming the silicide layer 5.

Thus, the IGBT according to the invention is completed.

[D] Advantage

As described above, in the present invention, the peak value of the concentration profile of the p-type impurity layer (the $p^+$-type emitter layer) is set at a value falling within the range of $10^{17}$-$10^{18}$ ions/cm$^3$. Further, the depth of the p-type impurity layer from the surface of the semiconductor substrate is set at a sufficient low value of 1.0 μm or less. Accordingly, the carrier injection coefficient when turning off the IGBT can be reduced, thereby increasing the speed of the turn-off operation.

Moreover, a $p^+$-type contact layer having a higher impurity concentration than the p-type impurity layer (the $p^+$-type emitter layer) is provided between the p-type impurity layer and the electrode 3. Since the depth of the p⁺-type contact layer from the surface of the semiconductor substrate is set at 0.2 μm or less, the p⁺-type contact layer does not influence the carrier injection coefficient at the time of turning off the semiconductor device. Further, since the peak value of the concentration profile of the p⁺-type contact layer is set at approx. $10^{19}$ ions/cm³, the contact resistance of the electrode contact section is reduced.

In addition, the p⁺-type contact layer has a sufficiently high impurity concentration, and a silicide layer is provided between the electrode and the p⁺-type contact layer. The position of the bottom of the silicide layer is made to correspond to that portion of the p⁺-type contact layer, at which the concentration profile of the contact layer assumes a peak value. Accordingly, the contact resistance of the electrode contact section is further reduced.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for manufacturing a semiconductor device comprising:
    ion-implanting first impurities of a first conductivity type into one surface of a semiconductor layer of a second conductivity type, for forming an impurity layer having a peak of an impurity concentration at a point of more than 0.2 μm and not more than 1.0 μm from the one surface of the semiconductor layer and at a point within a range of $10^{17}$-$10^{18}$ ions/cm³;
    ion-implanting second impurities of the first conductivity type into the one surface of the semiconductor layer, for forming a contact layer having a peak of an impurity concentration at a point of not more than 0.2 μm from the one surface of the semiconductor layer and at a point of $10^{19}$ ions/cm³ or more;
    forming a first electrode on the contact layer, which is made of a metal; and
    forming a silicide layer between the contact layer and the first electrode by a heat treatment, for making a boundary face between the contact layer and the silicide layer coincide with the peak of the impurity concentration of the contact layer.

2. The method according to claim 1, wherein a surface impurity concentration of the contact layer is at a point of $10^{18}$ ions/cm³ or more.

3. The method according to claim 1, wherein an impurity concentration of the semiconductor layer is at $10^{14}$ ions/cm³.

4. The method according to claim 1, wherein the ion-implanting of the first impurities is performed by application of an acceleration voltage of 60 keV and with a dose of $1\times10^{13}$ ions/cm².

5. The method according to claim 1, wherein the ion-implanting of the second impurities is performed by application of an acceleration voltage of 10 keV and with a dose of $1\times10^{14}$ ions/cm².

6. The method according to claim 1, further comprising:
    executing a thermal diffusion process after the ion-implanting of the first impurities.

7. The method according to claim 1, further comprising:
    executing a thermal diffusion process after the ion-implanting of the second impurities.

8. The method according to claim 1, further comprising:
    forming a second electrode on another surface of the semiconductor layer, wherein the semiconductor device is an IGBT.

9. The method according to claim 1, wherein the impurity layer is formed in substantially the entire one surface of the semiconductor layer.

10. The method according to claim 1, wherein the impurity layer is formed in a portion of the one surface of the semiconductor layer.

11. The method according to claim 10, further comprising:
    forming a base layer of the second conductivity type in an area except an area which has the impurity layer.

12. The method according to claim 11, wherein the impurity layer is deeper than the base layer.

13. The method according to claim 10, further comprising:
    forming an insulating film on the one surface of the semiconductor layer except an area which has the impurity layer.

14. The method according to claim 1, wherein the semiconductor layer is a semiconductor substrate.

* * * * *